(12) United States Patent
Huemoeller et al.

(10) Patent No.: US 8,323,771 B1
(45) Date of Patent: Dec. 4, 2012

(54) STRAIGHT CONDUCTOR BLIND VIA CAPTURE PAD STRUCTURE AND FABRICATION METHOD

(75) Inventors: Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 1079 days.

(21) Appl. No.: 11/839,277

(22) Filed: Aug. 15, 2007

(51) Int. Cl.
*B32B 3/24* (2006.01)
*H05K 1/11* (2006.01)

(52) U.S. Cl. ......... 428/138; 428/209; 257/774; 174/265

(58) Field of Classification Search .................. 428/138, 428/209; 257/774; 174/265
See application file for complete search history.

(56) References Cited

U.S. PATENT DOCUMENTS

| | | | |
|---|---|---|---|
| 3,833,838 A | 9/1974 | Christiansen | 361/777 |
| 3,868,724 A | 2/1975 | Perrino | 357/65 |
| 3,916,434 A | 10/1975 | Garboushian | 357/74 |
| 4,322,778 A | 3/1982 | Barbour et al. | 361/414 |
| 4,532,419 A | 7/1985 | Takeda | 235/492 |
| 4,642,160 A | 2/1987 | Burgess | 156/630 |
| 4,685,033 A | 8/1987 | Inoue | 361/414 |
| 4,706,167 A | 11/1987 | Sullivan | 361/406 |
| 4,716,049 A | 12/1987 | Patraw | 427/96 |
| 4,786,952 A | 11/1988 | MacIver et al. | 357/23.4 |
| 4,811,082 A | 3/1989 | Jacobs et al. | 357/80 |
| 4,897,338 A | 1/1990 | Spicciati et al. | 430/314 |
| 4,905,124 A | 2/1990 | Banjo et al. | 361/395 |
| 4,964,212 A | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |
| 5,021,047 A | 6/1991 | Movern | 604/110 |
| 5,072,075 A | 12/1991 | Lee et al. | 174/264 |
| 5,081,520 A | 1/1992 | Yoshii et al. | 357/80 |
| 5,108,553 A | 4/1992 | Foster et al. | 205/125 |
| 5,110,664 A | 5/1992 | Nakanishi et al. | 428/195 |
| 5,191,174 A | 3/1993 | Chang et al. | 174/266 |
| 5,229,550 A | 7/1993 | Bindra et al. | 174/262 |
| 5,239,448 A | 8/1993 | Perkins et al. | 361/764 |
| 5,247,429 A | 9/1993 | Iwase et al. | 362/29 |
| 5,283,459 A | 2/1994 | Hirano et al. | 257/419 |

(Continued)

FOREIGN PATENT DOCUMENTS

JP 05-109975 4/1993

(Continued)

OTHER PUBLICATIONS

Huemoeller et al., U.S. Appl. No. 11/527,104, filed Sep. 25, 2006, entitled "Semiconductor Package Substrate Fabrication Method".

(Continued)

*Primary Examiner* — William P Watkins, III
(74) *Attorney, Agent, or Firm* — McKay and Hodgson, LLP; Serge J. Hodgson

(57) ABSTRACT

A capture pad structure includes a first dielectric layer. A trace is embedded within the first dielectric layer. A capture pad is also embedded within the first dielectric layer, the capture pad being an end portion of the trace. A blind via aperture extends partially through the first dielectric layer from a principal surface of the first dielectric layer to the capture pad. By forming the capture pad as the end portion of the trace, formation of the capture pad requires no change in direction or complex motion of the laser.

11 Claims, 15 Drawing Sheets

U.S. PATENT DOCUMENTS

| | | | | |
|---|---|---|---|---|
| 5,371,654 | A | 12/1994 | Beaman et al. | 361/744 |
| 5,379,191 | A | 1/1995 | Carey et al. | 361/777 |
| 5,404,044 | A | 4/1995 | Booth et al. | 257/698 |
| 5,463,253 | A | 10/1995 | Waki et al. | 257/724 |
| 5,474,957 | A | 12/1995 | Urushima | 437/209 |
| 5,474,958 | A | 12/1995 | Djennas et al. | 437/211 |
| 5,508,938 | A | 4/1996 | Wheeler | 364/488 |
| 5,530,288 | A | 6/1996 | Stone | 257/700 |
| 5,531,020 | A | 7/1996 | Durand et al. | 29/840 |
| 5,574,309 | A | 11/1996 | Papapietro et al. | 257/679 |
| 5,581,498 | A | 12/1996 | Ludwig et al. | 365/63 |
| 5,582,858 | A | 12/1996 | Adamopoulos et al. | 427/96 |
| 5,616,422 | A | 4/1997 | Ballard et al. | 428/621 |
| 5,637,832 | A | 6/1997 | Danner | 174/260 |
| 5,674,785 | A | 10/1997 | Akram et al. | 437/217 |
| 5,719,749 | A | 2/1998 | Stopperan | 361/769 |
| 5,739,581 | A | 4/1998 | Chillara | 257/668 |
| 5,739,585 | A | 4/1998 | Akram et al. | 257/698 |
| 5,739,588 | A | 4/1998 | Ishida et al. | 257/782 |
| 5,742,479 | A | 4/1998 | Asakura | 361/737 |
| 5,744,224 | A | 4/1998 | Takeuchi et al. | 428/209 |
| 5,774,340 | A | 6/1998 | Chang et al. | 361/771 |
| 5,784,259 | A | 7/1998 | Asakura | 361/752 |
| 5,796,590 | A | 8/1998 | Klein | |
| 5,798,014 | A | 8/1998 | Weber | 156/263 |
| 5,822,190 | A | 10/1998 | Iwasaki | 361/737 |
| 5,826,330 | A | 10/1998 | Isoda et al. | 29/852 |
| 5,835,355 | A | 11/1998 | Dordi | 361/760 |
| 5,847,453 | A | 12/1998 | Uematsu et al. | 257/728 |
| 5,872,399 | A | 2/1999 | Lee | 257/738 |
| 5,894,108 | A | 4/1999 | Mostafazadeh et al. | 174/52.4 |
| 5,903,052 | A | 5/1999 | Chen et al. | 257/706 |
| 5,928,767 | A | 7/1999 | Gebhardt et al. | 428/209 |
| 5,936,843 | A | 8/1999 | Ohshima et al. | 361/760 |
| 5,952,611 | A | 9/1999 | Eng et al. | 174/52.4 |
| 6,004,619 | A | 12/1999 | Dippon et al. | 427/97 |
| 6,013,948 | A | 1/2000 | Akram et al. | 257/698 |
| 6,021,564 | A | 2/2000 | Hanson | 29/852 |
| 6,028,364 | A | 2/2000 | Ogino et al. | 257/778 |
| 6,034,427 | A | 3/2000 | Lan et al. | 257/698 |
| 6,035,527 | A | 3/2000 | Tamm | |
| 6,040,622 | A | 3/2000 | Wallace | 257/679 |
| 6,060,778 | A | 5/2000 | Jeong et al. | 257/710 |
| 6,064,576 | A | 5/2000 | Edwards et al. | 361/776 |
| 6,069,407 | A | 5/2000 | Hamzehdoost | 257/774 |
| 6,072,243 | A | 6/2000 | Nakanishi | 257/783 |
| 6,081,036 | A | 6/2000 | Hirano et al. | 257/773 |
| 6,119,338 | A | 9/2000 | Wang et al. | 29/852 |
| 6,122,171 | A | 9/2000 | Akram et al. | 361/704 |
| 6,127,833 | A | 10/2000 | Wu et al. | 324/755 |
| 6,160,705 | A | 12/2000 | Stearns et al. | 361/704 |
| 6,172,419 | B1 | 1/2001 | Kinsman | 257/737 |
| 6,175,087 | B1 | 1/2001 | Keesler et al. | 174/261 |
| 6,184,463 | B1 | 2/2001 | Panchou et al. | 174/52.4 |
| 6,194,250 | B1 | 2/2001 | Melton et al. | |
| 6,204,453 | B1 | 3/2001 | Fallon et al. | 174/255 |
| 6,214,641 | B1 | 4/2001 | Akram | 438/107 |
| 6,228,466 | B1 | 5/2001 | Tsukada et al. | |
| 6,235,554 | B1 | 5/2001 | Akram et al. | 438/109 |
| 6,239,485 | B1 | 5/2001 | Peters et al. | 257/700 |
| D445,096 | S | 7/2001 | Wallace | D14/117 |
| D446,525 | S | 8/2001 | Okamoto et al. | D14/436 |
| 6,274,821 | B1 | 8/2001 | Echigo et al. | 174/261 |
| 6,280,641 | B1 | 8/2001 | Gaku et al. | 216/17 |
| 6,316,285 | B1 | 11/2001 | Jiang et al. | 438/106 |
| 6,351,031 | B1 | 2/2002 | Iijima et al. | 257/698 |
| 6,353,999 | B1 | 3/2002 | Cheng | 29/852 |
| 6,365,975 | B1 | 4/2002 | DiStefano et al. | 257/777 |
| 6,376,906 | B1 | 4/2002 | Asai et al. | 257/698 |
| 6,388,203 | B1 | 5/2002 | Rinne et al. | 174/261 |
| 6,392,160 | B1 | 5/2002 | Andry et al. | 174/261 |
| 6,395,578 | B1 | 5/2002 | Shin et al. | 438/106 |
| 6,405,431 | B1 | 6/2002 | Shin et al. | 29/852 |
| 6,406,942 | B2 | 6/2002 | Honda | 438/119 |
| 6,407,341 | B1 | 6/2002 | Anstrom et al. | 174/255 |
| 6,407,930 | B1 | 6/2002 | Hsu | 361/784 |
| 6,451,509 | B2 | 9/2002 | Keesler et al. | 430/311 |
| 6,465,747 | B2 | 10/2002 | DiStefano et al. | |
| 6,479,762 | B2 | 11/2002 | Kusaka | 174/261 |
| 6,497,943 | B1 | 12/2002 | Jimarez et al. | 428/209 |
| 6,517,995 | B1 | 2/2003 | Jacobson et al. | 430/320 |
| 6,534,391 | B1 | 3/2003 | Huemoeller et al. | 438/612 |
| 6,544,638 | B2 | 4/2003 | Fischer et al. | 428/322.7 |
| 6,548,393 | B1 | 4/2003 | Lin | 438/618 |
| 6,586,682 | B2 | 7/2003 | Strandberg | 174/255 |
| 6,608,757 | B1 | 8/2003 | Bhatt et al. | 361/748 |
| 6,660,559 | B1 | 12/2003 | Huemoeller et al. | 438/106 |
| 6,699,780 | B1 | 3/2004 | Chiang et al. | 438/612 |
| 6,715,204 | B1 | 4/2004 | Tsukada et al. | 29/847 |
| 6,727,645 | B2 | 4/2004 | Tsujimura et al. | 313/504 |
| 6,730,857 | B2 | 5/2004 | Konrad et al. | 174/257 |
| 6,740,964 | B2 | 5/2004 | Sasaki | |
| 6,753,612 | B2 | 6/2004 | Adae-Amoakoh et al. | 257/774 |
| 6,787,443 | B1 | 9/2004 | Boggs et al. | 438/612 |
| 6,800,506 | B1 | 10/2004 | Lin et al. | 438/107 |
| 6,803,528 | B1 | 10/2004 | Koyanagi | 174/262 |
| 6,815,709 | B2 | 11/2004 | Clothier et al. | 257/40 |
| 6,815,739 | B2 | 11/2004 | Huff et al. | 257/275 |
| 6,919,514 | B2 | 7/2005 | Konrad et al. | |
| 7,005,750 | B2 | 2/2006 | Liu | |
| 7,242,081 | B1 | 7/2007 | Lee | |
| 7,345,361 | B2 | 3/2008 | Mallik et al. | |
| 7,372,151 | B1 | 5/2008 | Fan et al. | |
| 7,388,394 | B1 * | 6/2008 | Primavera et al. | 324/765 |
| 2002/0017712 | A1 | 2/2002 | Bessho et al. | 257/700 |
| 2003/0128096 | A1 | 7/2003 | Mazzochette | 338/22 |
| 2006/0183316 | A1 | 8/2006 | Larnerd et al. | 438/622 |
| 2006/0186537 | A1 * | 8/2006 | Goto et al. | 257/734 |
| 2006/0216860 | A1 * | 9/2006 | Pendse | 438/108 |
| 2007/0273049 | A1 | 11/2007 | Khan et al. | |
| 2007/0290376 | A1 | 12/2007 | Zhao et al. | |
| 2008/0230887 | A1 | 9/2008 | Sun et al. | |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

IBM Technical Disclosure Bulletin, "Microstructure Solder Mask by Means of a Laser", vol. 36, Issue 11, p. 589, Nov. 1, 1993, (NN9311589).

Kuo, U.S. Appl. No. 11/615,467, filed Dec. 22, 2006, entitled "Blind Via Capture Pad Structure and Fabrication Method".

Berry et al., "Thin Stacked Interposer Package", U.S. Appl. No. 11/865,617, filed Oct. 1, 2007.

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", 58th *ECTC Proceedings*, May 2008, Lake Buena Vista, FL, 6 pages, IEEE.

Kuo, "Blind Via Capture Pad Structure and Method", U.S. Appl. No. 12/800,757, filed May 21, 2010.

* cited by examiner

STRAIGHT CONDUCTOR BLIND VIA CAPTURE PAD STRUCTURE AND FABRICATION METHOD

BACKGROUND OF THE INVENTION

1. Field of the Invention

The present invention relates generally to substrates for mounting of electronic components. More particularly, the present invention relates to a blind via capture pad structure and method for fabricating the same.

2. Description of the Related Art

In multi-layer substrates, an electrically conductive circular capture pad is formed in a first dielectric layer. The circular capture pad is used to form an electrical connection with an electrically conductive blind via formed through a second dielectric layer mounted to the first dielectric layer.

To compensate for registration errors, the circular capture pad is much larger in diameter than the bottom of the blind via. This guarantees that the bottom of the blind via will be positioned within the diameter of the capture pad insuring electrical connection between the blind via and the circular capture pad.

Laser ablation is used to form the circular capture pad in the first dielectric layer. More particularly, a laser ablation process is used in which a focused laser beam is guided in a helical motion, sometimes called trepanning, to form a circular capture pad opening. The circular capture pad opening is then filled with electrically conductive material to form the circular capture pad.

However, the laser ablation process used to form the circular capture pad opening is relatively slow. More particularly, the laser ablation process requires that a large area of the first dielectric layer be removed to form the circular capture pad opening. Further, moving the focused laser beam in a helical motion is inherently slow.

SUMMARY OF THE INVENTION

In accordance with one embodiment, a capture pad structure includes a lower dielectric layer, a capture pad embedded within the lower dielectric layer, the capture pad comprising a plurality of linear segments.

In accordance with one embodiment, the capture pad is formed using a laser ablation process. In accordance with this embodiment, the dielectric layer is laser-ablated to form channels therein. More particularly, a focused laser beam is moved linearly, i.e., in straight lines, to form linear channels in the dielectric layer. These channels are filled with an electrically conductive material to form the capture pad.

As the focused laser beam is moved in straight lines rapidly, the laser ablation process used to form the capture pad is fast and thus performed at a minimal cost.

Further, the total area of the capture pad is less than a circular capture pad having a diameter equal to the length of the linear segments of the capture pad. Accordingly, the amount of the dielectric layer laser-ablated (removed) to form the capture pad is minimal. As the amount of the dielectric layer removed is minimal, the laser ablation process used to form the capture pad is fast and thus performed at a minimal cost.

Further, an upper dielectric layer is mounted to the lower dielectric layer. A blind via aperture is formed using a laser ablation over drill process. During this laser ablation over drill process, the energy and ablation time of the focused laser beam is set sufficiently high to laser ablate completely through the upper dielectric layer and to partially laser ablate the lower dielectric layer around the capture pad.

A blind via with interlocking structure is formed within the blind via aperture. The interlocking structure of the blind via extends around the capture pad. Accordingly, the mechanical strength in the bond between the blind via and the capture pad is maximized. In this manner, the reliability of the bond between the blind via and the capture pad is insured.

In accordance with another embodiment, a capture pad structure includes a first dielectric layer. A trace is embedded within the first dielectric layer. A capture pad is also embedded within the first dielectric layer, the capture pad being an end portion of the trace. A blind via aperture extends partially through the first dielectric layer from a principal surface of the first dielectric layer to the capture pad. By forming the capture pad as the end portion of the trace, formation of the capture pad requires no change in direction or complex motion of the laser, i.e., the focused laser beam.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
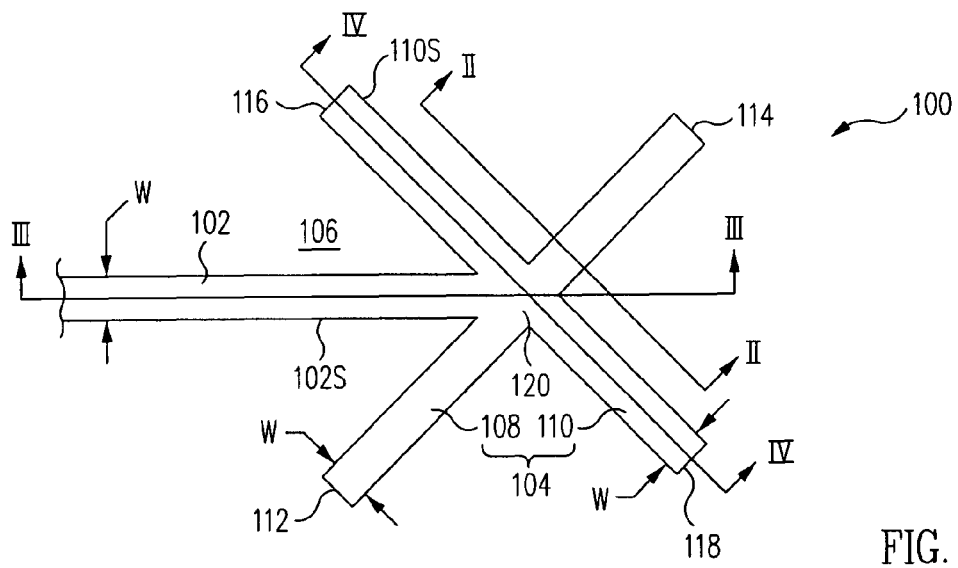
FIG. 1 is a top perspective view of a capture pad structure in accordance with one embodiment of the present invention.

In accordance with one embodiment, referring to FIGS. 1, 2, 3, and 4 together, a capture pad structure 100 includes a lower dielectric layer 106, a capture pad 104 embedded within lower dielectric layer 106, capture pad 104 comprising a plurality of linear segments 108, 110.

In accordance with one embodiment, capture pad 104 is formed using a laser ablation process. In accordance with this embodiment, dielectric layer 106 is laser-ablated to form channels therein. More particularly, a focused laser beam is moved linearly, i.e., in straight lines, to form linear channels in dielectric layer 106. These channels are filled with an electrically conductive material to form capture pad 104.

More particularly, the focused laser beam is moved in a first straight line to form a first channel 122 in dielectric layer 106 in which first linear segment 108 is located and moved in a second straight line to form a second channel 124 in which second linear segment 110 is located. As the focused laser beam is moved in straight lines rapidly, the laser ablation process used to form capture pad 104 is fast and thus performed at a minimal cost.

Further, the total area of first linear segment 108 and second linear segment 110 is less than a circular capture pad having a diameter equal to the length of first linear segment 108 or second linear segment 110 in accordance with this embodiment. Accordingly, the amount of dielectric layer 106 laser-ablated (removed) to form channels 122, 124 and thus capture pad 104 is minimal. As the amount of dielectric layer 106 removed to form channels 122, 124 is minimal, the laser ablation process used to form capture pad 104 is fast and thus performed at a minimal cost.

Figure 8:
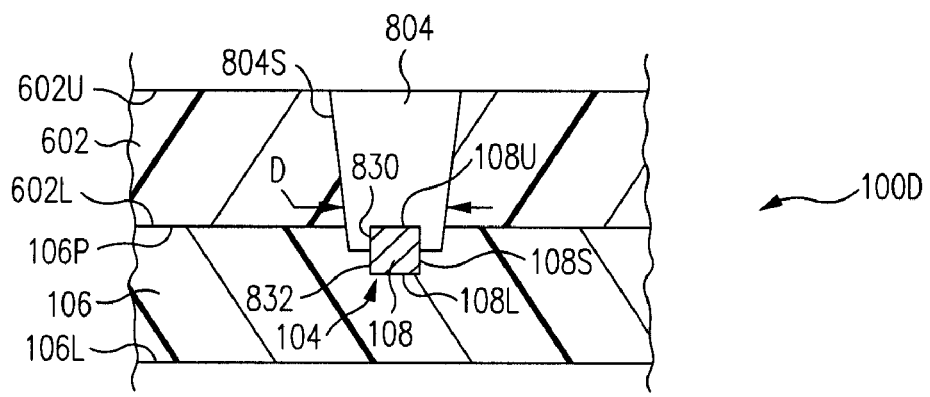
FIG. 8 is a cross-sectional view of a capture pad structure in accordance with another embodiment.

Further, referring now to FIG. 8, an upper dielectric layer 602 is mounted to lower dielectric layer 106. A blind via aperture 804 is formed using a laser ablation over drill process. During this laser ablation over drill process, the energy and ablation time of the focused laser beam is set sufficiently high to laser ablate completely through upper dielectric layer 602 and to partially laser ablate lower dielectric layer 106 around capture pad 104.

Figure 9A:
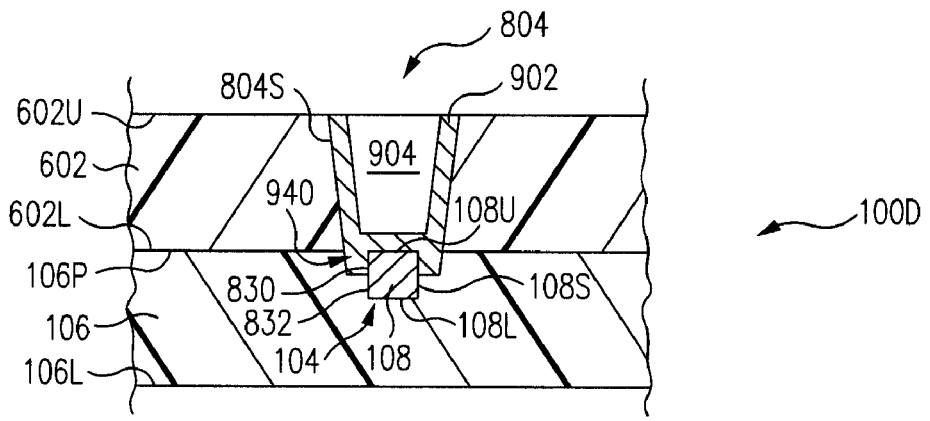
FIG. 9A is a cross-sectional view of the capture pad structure of FIG. 8 at a further stage of fabrication in accordance with one embodiment.

Referring now to FIG. 9A, a blind via 902 with interlocking structure 940 is formed within blind via aperture 804. Interlocking structure 940 of blind via 902 extends around capture pad 104. Accordingly, the mechanical strength in the bond between blind via 902 and capture pad 104 is maximized. In this manner, the reliability of the bond between blind via 902 and capture pad 104 is insured.

Figure 2:
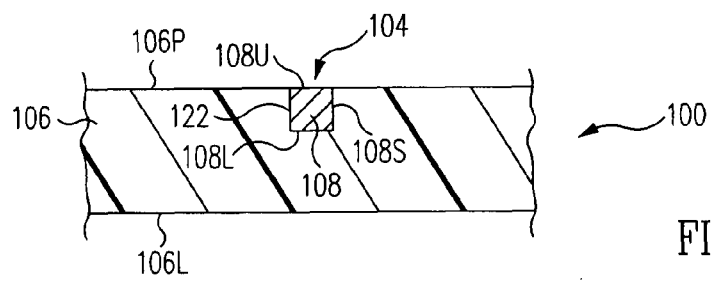
FIG. 2 is a cross-sectional view of the capture pad structure along the line II-II of FIG. 1.
Figure 3:
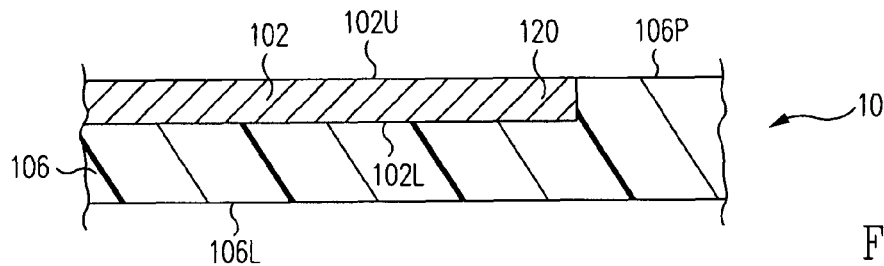
FIG. 3 is a cross-sectional view of the capture pad structure along the line II-III of FIG. 1.
Figure 4:
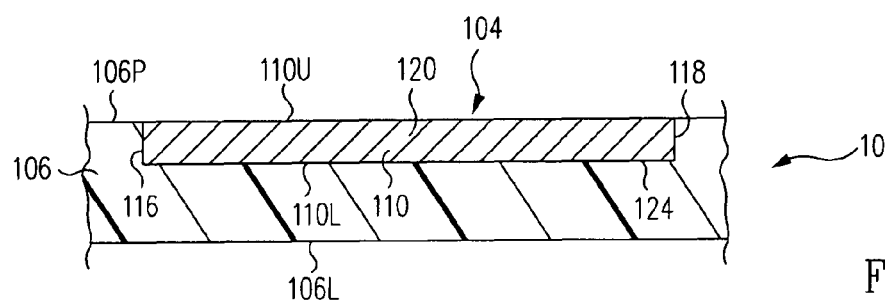
FIG. 4 is a cross-sectional view of the capture pad structure along the line IV-IV of FIG. 1.

More particularly, FIG. 1 is a top perspective view of a capture pad structure 100 in accordance with one embodiment of the present invention. FIG. 2 is a cross-sectional view of capture pad structure 100 along the line II-II of FIG. 1. FIG. 3 is a cross-sectional view of capture pad structure 100 along the line of FIG. 1. FIG. 4 is a cross-sectional view of capture pad structure 100 along the line IV-IV of FIG. 1.

Referring now to FIGS. 1, 2, 3 and 4 together, capture pad structure 100 includes a trace 102, a capture pad 104, and a lower, e.g., first, dielectric layer 106. Capture pad 104 includes a first linear segment 108 and a second linear segment 110.

First linear segment 108 is linear, i.e., has an absence of curves. More particularly, first linear segment 108 is a straight line extending between a first end 112 and a second end 114 of first linear segment 108. First linear segment 108 has a uniform width W equal to the width of a focused laser beam used to form the channel in dielectric layer 106 in which first linear segment 108 is formed in one embodiment.

Similarly, second linear segment 110 is linear, i.e., has an absence of curves. More particularly, second linear segment 110 is a straight line extending between a first end 116 and a second end 118 of second linear segment 110. Second linear segment 110 also has a uniform width W equal to the width of a focused laser beam used to form the channel in dielectric layer 106 in which second linear segment 110 is formed in one embodiment.

In the embodiment illustrated in FIG. 1, first linear segment 108 has a length, i.e., the distance between first and second ends 112, 114, equal to a length of second linear segment 110, i.e., the distance between first and second ends 116, 118. However, in another embodiment, first linear segment 108 has a length less than or greater than a length of second linear segment 110.

First linear segment 108 intersects second linear segment 110 at a linear segment intersection 120. In accordance with this embodiment, first linear segment 108 is perpendicular to second linear segment 110 although the angle of intersection of first linear segment 108 to second linear segment 110 is greater or less than 90 degrees in other embodiments. Although the terms perpendicular, parallel, and similar terms are used herein, it is to be understood that the described features may not be exactly perpendicular or parallel, but only substantially perpendicular or parallel to within acceptable manufacturing tolerances.

First linear segment 108 intersects second linear segment 110 in the middle of second linear segment 110. Accordingly, the distance between first end 116 of second linear segment 110 and intersection 120 equals the distance between second end 118 of second linear segment 110 and intersection 120.

Similarly, second linear segment 110 intersects first linear segment 108 in the middle of first linear segment 108. Accordingly, the distance between first end 112 of first linear segment 108 and intersection 120 equals the distance between second end 114 of first linear segment 108 and intersection 120.

Although in the embodiment illustrated in FIG. 1, first linear segment 108 intersects the middle of second linear segment 110 and vice versa, in another embodiment, first linear segment 108 intersects second linear segment 110 at a position offset from the middle of second linear segment 110 and/or vice versa.

Trace 102 is electrically connected to intersection 120 and thus to capture pad 104. Trace 102 is electrically connected to one or more electrically conductive structures (not shown) of capture pad structure 100, for example, to lands, solder balls, or other electrically conductive structures on principal surface 106P and/or lower surface 106L of dielectric layer 106.

Trace 102 also has a uniform width W equal to the width of a focused laser beam used to form the channel in dielectric layer 106 in which trace 102 is formed in one embodiment. Trace 102 is formed of one or more linear segments.

Further, trace 102 and capture pad 104 are embedded in dielectric layer 106. More particularly, dielectric layer 106 has a principal, e.g., first, surface 106P and a lower, e.g., second, surface 106L opposite principal surface 106P.

Trace 102, first linear segment 108, second linear segment 110 include exposed upper, e.g., first, surfaces 102U, 108U, 110U, respectively, coplanar, i.e., lying in the same plane, with principal surface 106P of dielectric layer 106. Accordingly, upper surfaces 102U, 108U, 110U are exposed from dielectric layer 106.

Further, trace 102, first linear segment 108, second linear segment 110 include coplanar lower, e.g., second, surfaces 102L, 108L, 110L, respectively, below principal surface 106P of dielectric layer 106 and within dielectric layer 106. More particularly, lower surfaces 102L, 108L, 110L are located between principal surface 106P and lower surface 106L of dielectric layer 106 such that dielectric layer 106 exists between lower surfaces 102L, 108L, 110L and lower surface 106L.

Further, trace 102, first linear segment 108, second linear segment 110 include sidewalls 102S, 108S, 110S extending between upper surfaces 102U, 108U, 110U and lower surfaces 102L, 108L, 110L, respectively.

In accordance with one embodiment, trace 102 and capture pad 104 are formed using a laser ablation process. In accordance with this embodiment, dielectric layer 106 is laser-ablated to form channels therein. More particularly, a focused laser beam is moved linearly, i.e., in straight lines, to form linear channels in dielectric layer 106 having width W equal to the width of the focused laser beam. These channels are filled with an electrically conductive material, e.g., by plating and/or filling with an electrically conductive adhesive, to form trace 102 and capture pad 104.

Generally, a channel is a trench, opening, or open space in dielectric layer 106 that has a length extending in a horizontal direction parallel to principal surface 106P of dielectric layer 106. First linear segment 108, second linear segment 110, and trace 102 are formed of electrically conductive material that fills the channels in dielectric layer 106.

In accordance with this embodiment, the laser ablation process used to form capture pad 104 is fast and thus performed at a minimal cost. More particularly, the focused laser beam is moved in a first straight line to form a first channel 122 in dielectric layer 106 in which first linear segment 108 is located and moved in a second straight line to form a second channel 124 in which second linear segment 110 is located. As the focused laser beam is moved in straight lines rapidly, the laser ablation process used to form capture pad 104 is fast and thus performed at a minimal cost.

Further, the total area of first linear segment 108 and second linear segment 110 is less than a circular capture pad having a diameter equal to the length of first linear segment 108 or second linear segment 110 in accordance with this embodiment. Accordingly, the amount of dielectric layer 106 laser-ablated (removed) to form channels 122, 124 and thus capture pad 104 is minimal. As the amount of dielectric layer 106 removed to form channels 122, 124 is minimal, the laser ablation process used to form capture pad 104 is fast and thus performed at a minimal cost.

Figure 5:
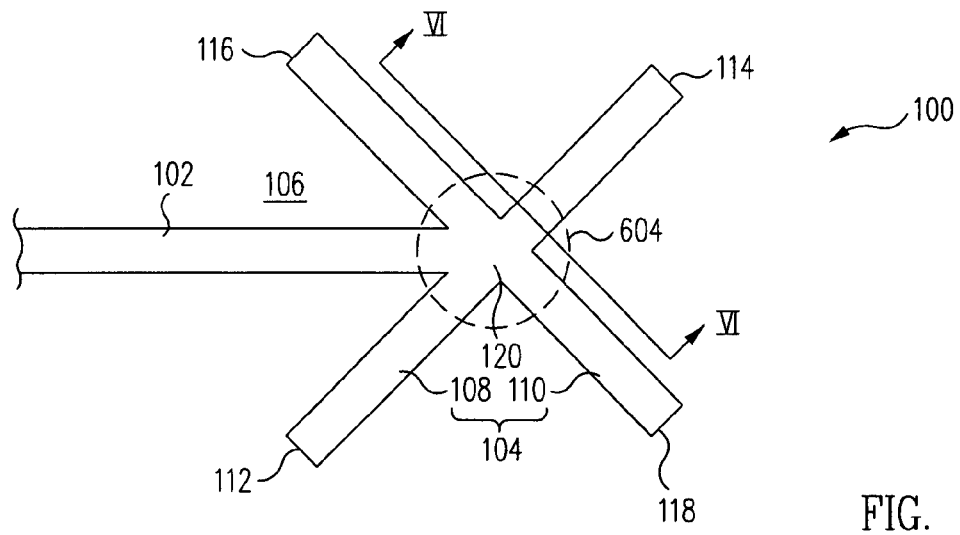
FIG. 5 is a top perspective view of the capture pad structure of FIG. 1 at a further stage during fabrication in accordance with one embodiment of the present invention.
Figure 6:
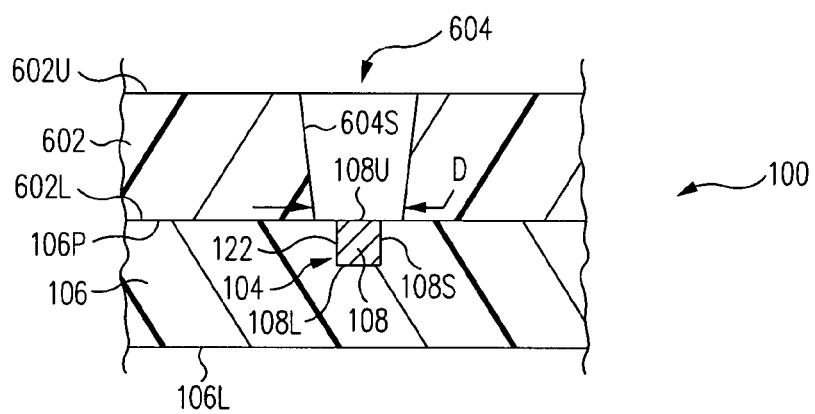
FIG. 6 is a cross-sectional view of the capture pad structure of FIG. 5 along the line VI-VI in accordance with one embodiment.

FIG. 5 is a top perspective view of capture pad structure 100 of FIG. 1 at a further stage during fabrication in accordance with one embodiment of the present invention. FIG. 6 is a cross-sectional view of capture pad structure 100 of FIG. 5 along the line VI-VI in accordance with one embodiment.

Referring now to FIGS. 5 and 6 together, an upper, e.g., second, dielectric layer 602 is mounted to lower dielectric layer 106. Upper dielectric layer 602 is not illustrated in FIG. 5 to allow visualization of capture pad 104 and trace 102.

More particularly, a lower, e.g., first surface 602L of upper dielectric layer 602 is mounted to principal surface 106P of lower dielectric layer 106. In one embodiment, lower surface 602L of upper dielectric 602 and/or principal surface 106P of lower dielectric layer 106 is adhesive and/or includes an adhesive such that upper dielectric layer 602 is adhesively bonded to lower dielectric layer 106. In another embodiment, second dielectric layer 602 is applied to lower dielectric layer 106 in a liquid form and then cured, e.g., upper dielectric layer 602 is a cured liquid encapsulant, molding compound, a spin on coating, or other cured material.

A blind via aperture 604 is formed through upper dielectric layer 602, e.g., using laser ablation. Blind via aperture 604 extends through upper dielectric layer 602 from an upper, e.g., second, surface 602U to lower surface 602L and to capture pad 104. Blind via aperture 604 is defined by a blind via aperture sidewall 604S that extends from upper surface 602U to lower surface 602L.

Generally, blind via aperture 604 is aligned with capture pad 104. More particularly, a portion of capture pad 104 is exposed through blind via aperture 604. The length of first linear segment 108 and second linear segment 110 is greater than a diameter D of blind via aperture 604 at lower surface 602L of upper dielectric layer 602. Accordingly, tolerance in the registration (positioning) of blind via aperture 604 relative to capture pad 104 is accommodated.

Figure 7A:
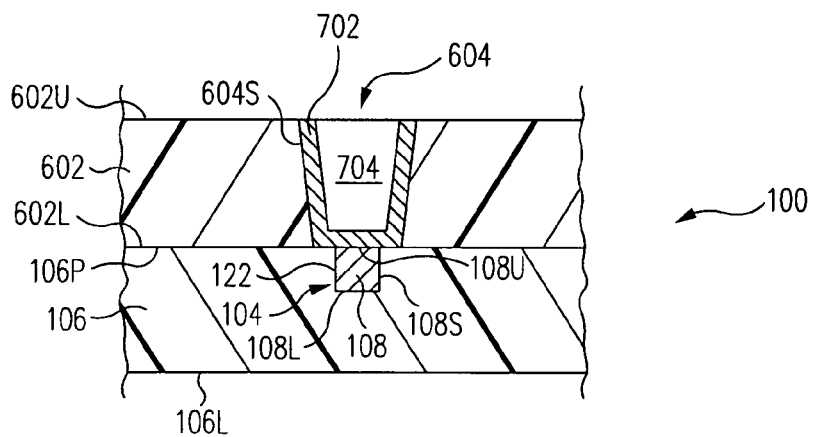
FIG. 7A is a cross-sectional view of the capture pad structure of FIG. 6 at a further stage of fabrication in accordance with one embodiment.

FIG. 7A is a cross-sectional view of capture pad structure 100 of FIG. 6 at a further stage of fabrication in accordance with one embodiment. Referring now to FIG. 7A, an electrically conductive blind via 702 is formed within blind via aperture 604. Blind via 702, e.g., an electrically conductive plated copper seed layer, is formed on blind via aperture sidewall 604S and extends from upper surface 602U to lower surface 602L of upper dielectric layer 602. Blind via 702, i.e., a hollow via, does not completely fill blind via aperture 604 such that a space 704 exists within blind via 702.

Blind via 702 is electrically connected to (e.g., plated on) capture pad 104. Accordingly, blind via 702 forms the electrical connection to capture pad 104 through upper dielectric layer 602.

Figure 7B:
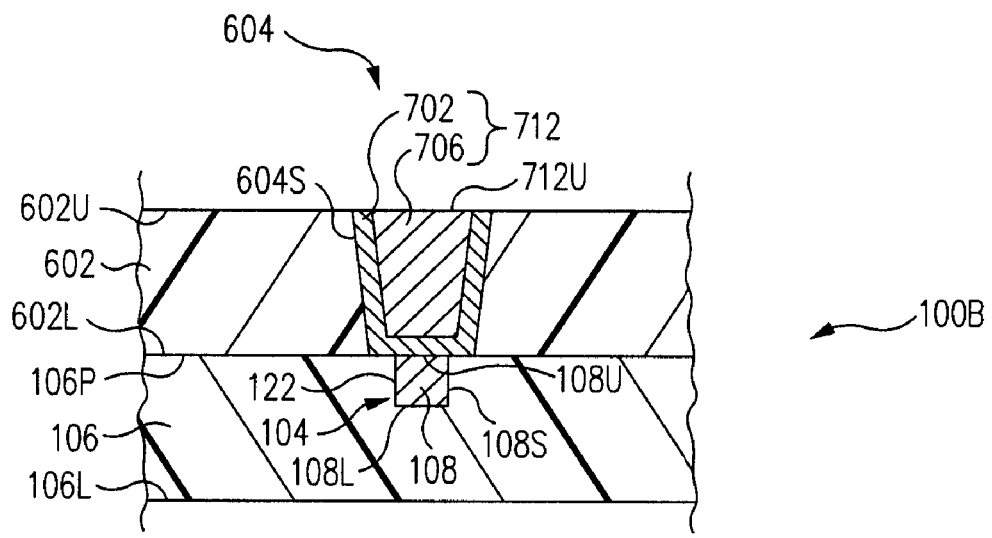
FIG. 7B is a cross-sectional view of a capture pad structure in accordance with another embodiment.

FIG. 7B is a cross-sectional view of a capture pad structure 100B in accordance with another embodiment. Capture pad structure 100B of FIG. 7B is similar to capture pad structure 100 of FIG. 7A and only the significant differences are discussed below.

Referring now to FIG. 7B, a blind via 712 is a multilayer blind via including a hollow blind via 702 and a hollow via filling 706. Hollow blind via 702 is substantially similar to blind via 702 of capture pad structure 100 of FIG. 7A. Hollow via filling 706 is electrically conductive material, e.g., plated metal, solder or electrically conductive adhesive, which fills the space within hollow blind via 702. Accordingly, blind via 712 has a planar upper surface 712U, e.g., a contact or land, coplanar with upper surface 602U of upper dielectric layer 602.

Figure 7C:
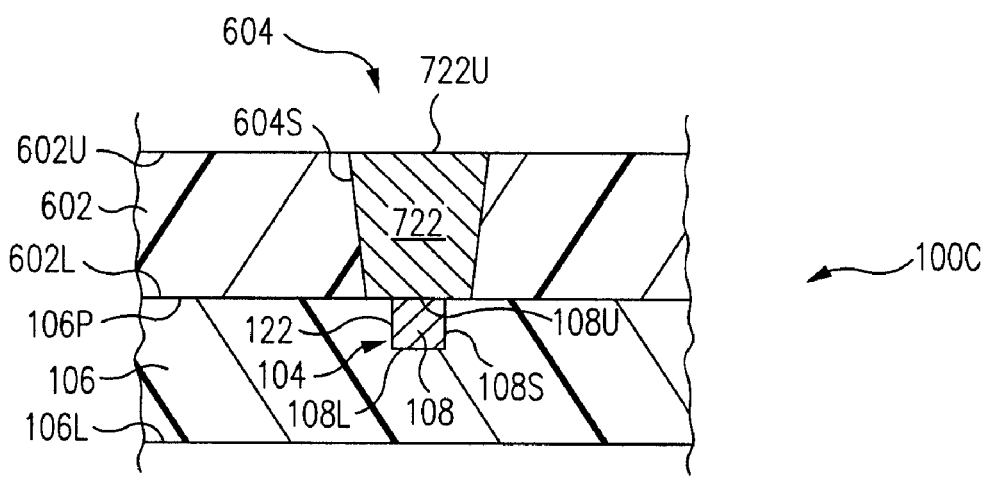
FIG. 7C is a cross-sectional view of a capture pad structure in accordance with yet another embodiment.

FIG. 7C is a cross-sectional view of a capture pad structure 100C in accordance with yet another embodiment. Capture pad structure 100C of FIG. 7C is similar to capture pad structure 100 of FIG. 7A and only the significant differences are discussed below.

Referring now to FIG. 7C, a blind via 722 is electrically conductive material, e.g., plated metal, solder or electrically conductive adhesive, which fills blind via aperture 604.

Blind via 722 extends from upper surface 602U to lower surface 602L of upper dielectric layer 602. Blind via 722 completely fills blind via aperture 604. Accordingly, blind via 722 has a planar upper surface 722U, e.g., a contact or land, coplanar with upper surface 602U of upper dielectric layer 602.

Blind via 722 is electrically connected to capture pad 104. Accordingly, blind via 722 forms the electrical connection to capture pad 104 through upper dielectric layer 602.

FIG. 8 is a cross-sectional view of a capture pad structure 100D in accordance with another embodiment. Capture pad structure 100D of FIG. 8 is similar to capture pad structure 100 of FIG. 6 and only the significant differences are discussed below.

Referring now to FIG. 8, a blind via aperture 804 is formed through upper dielectric layer 602, e.g., using laser ablation. Blind via aperture 804 extends through upper dielectric layer 602 from upper surface 602U to lower surface 602L and to capture pad 104. Blind via aperture 804 is defined by a blind via aperture sidewall 804S that extends from upper surface 602U to lower surface 602L and partially into lower dielectric layer 106.

Blind via aperture 804 extends into lower dielectric layer 106 around capture pad 104. Blind via aperture 804 is formed using a laser ablation over drill process. During this laser ablation over drill process, the energy and ablation time of the focused laser beam, e.g., a low fluence laser beam, is set sufficiently high to laser ablate completely through upper dielectric layer 602 and to partially laser ablate lower dielectric layer 106 around capture pad 104.

Dielectric layer 106, e.g., molding compound, laminate material, flexible tape, or other dielectric material, is selectively laser ablated relative to capture pad 104, e.g., an electrically conductive material such as copper. Stated another way, dielectric layer 106 is laser ablated (removed) by the focused laser beam whereas capture pad 104 is substantially unaffected by the focused laser beam. Accordingly, during the laser ablation over drill process, dielectric layer 106 is removed around capture pad 104.

As shown in FIG. 8, dielectric layer 106 is over drilled such that a portion of the sidewalls of capture pad 104 is exposed by blind via aperture 804. The lower surface of capture pad 104 remains embedded and in contact with lower dielectric layer 106.

To illustrate, lower dielectric layer 106 is removed around an upper, e.g., first, portion 830 of sidewalls 108S of first linear segment 108 as illustrated in FIG. 8. A lower, e.g., second, portion 832 of sidewalls 108S of first linear segment 108 remains embedded and in contact with lower dielectric layer 106.

Generally, blind via aperture 804 is aligned with capture pad 104. More particularly, a portion of capture pad 104 is exposed through blind via aperture 804. The length of first linear segment 108 and second linear segment 110 is greater than a diameter D of blind via aperture 804 at lower surface 602L of upper dielectric layer 602. Accordingly, tolerance in the registration (positioning) of blind via aperture 804 relative to capture pad 104 is accommodated.

FIG. 9A is a cross-sectional view of capture pad structure 100D of FIG. 8 at a further stage of fabrication in accordance with one embodiment. Referring now to FIG. 9A, an electrically conductive blind via 902 is formed within blind via aperture 804. Blind via 902, e.g., an electrically conductive plated copper seed layer, is formed on blind via aperture sidewall 804S and extends from upper surface 602U to lower surface 602L of upper dielectric layer 602. Blind via 902, i.e., a hollow via, does not completely fill blind via aperture 804 such that a space 904 exists within blind via 902.

Blind via 902 is electrically connected to (e.g., plated on) capture pad 104. Blind via 902 extends around capture pad 104. More particularly, blind via 902 directly contacts the upper surface of capture pad 104 and a portion of the sidewalls of capture pad 104.

To illustrate, an interlocking structure 940 of blind via 902 contacts upper surface 108U and upper portion 830 of sidewalls 108S of first linear segment 108 as illustrated in FIG. 9A. Accordingly, blind via 902 forms the electrical connection to capture pad 104 through upper dielectric layer 602.

In accordance with this example, by over drilling into lower dielectric layer 106 and around capture pad 104 during formation of blind via aperture 804 as discussed above, interlocking structure 940 of blind via 902 extends around capture pad 104. By forming a blind via 902 with interlocking structure 940 around capture pad 104, the mechanical strength in the bond between blind via 902 and capture pad 104 is maximized. In this manner, the reliability of the bond between blind via 902 and capture pad 104 is insured.

Figure 9B:
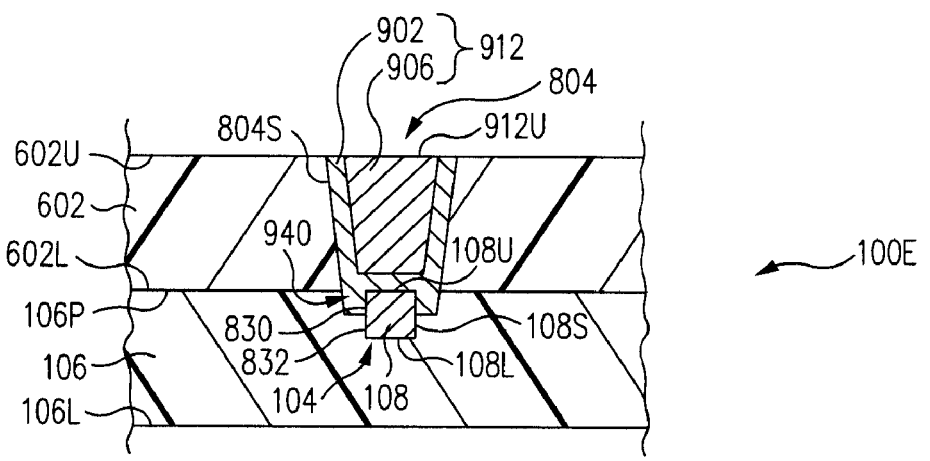
FIG. 9B is a cross-sectional view of a capture pad structure in accordance with another embodiment.

FIG. 9B is a cross-sectional view of a capture pad structure 100E in accordance with another embodiment. Capture pad structure 100E of FIG. 9B is similar to capture pad structure 100D of FIG. 9A and only the significant differences are discussed below.

Referring now to FIG. 9B, a blind via 912 is a multilayer blind via including a hollow blind via 902 and a hollow via filling 906. Hollow blind via 902 is substantially similar to blind via 902 of capture pad structure 100D of FIG. 9A. Hollow via filling 906 is electrically conductive material, e.g., plated metal, solder or electrically conductive adhesive, which fills the space within hollow blind via 902. Accordingly, blind via 912 has a planar upper surface 912U, e.g., a contact or land, coplanar with upper surface 602U of upper dielectric layer 602.

Figure 9C:
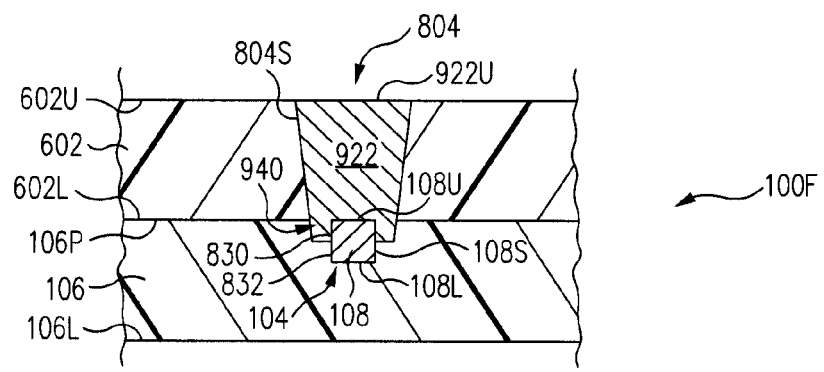
FIG. 9C is a cross-sectional view of a capture pad structure in accordance with yet another embodiment.

FIG. 9C is a cross-sectional view of a capture pad structure 100F in accordance with yet another embodiment. Capture pad structure 100F of FIG. 9C is similar to capture pad structure 100D of FIG. 9A and only the significant differences are discussed below.

Referring now to FIG. 9C, a blind via 922 is electrically conductive material, e.g., plated metal, solder or electrically conductive adhesive, which fills blind via aperture 804.

Blind via 922 extends from upper surface 602U to lower surface 602L of upper dielectric layer 602. Blind via 922 completely fills blind via aperture 804. Accordingly, blind via 922 has a planar upper surface 922U, e.g., a contact or land, coplanar with upper surface 602U of upper dielectric layer 602.

Blind via 922 is electrically connected to capture pad 104. Blind via 922 extends around capture pad 104. More particularly, blind via 922 directly contacts the upper surface of capture pad 104 and a portion of the sidewalls of capture pad 104.

To illustrate, an interlocking structure 940 of blind via 922 contacts upper surface 108U and upper portion 830 of sidewalls 108S of first linear segment 108 as illustrated in FIG. 9C. Accordingly, blind via 922 forms the electrical connection to capture pad 104 through upper dielectric layer 602.

In accordance with this example, by over drilling into lower dielectric layer 106 and around capture pad 104 during formation of blind via aperture 804 as discussed above, interlocking structure 940 of blind via 922 extends around capture pad 104. By forming blind via 922 with interlocking structure 940 around capture pad 104, the mechanical strength in the bond between blind via 922 and capture pad 104 is maximized. In this manner, the reliability of the bond between blind via 922 and capture pad 104 is insured.

Although only two dielectric layers 106, 602 are illustrated, in light of this disclosure, those of skill in the art will understand that embodiments of the present invention are applicable to any multi-layer substrates needing inter-layer connections, e.g., having two or more dielectric layers.

Figure 10:
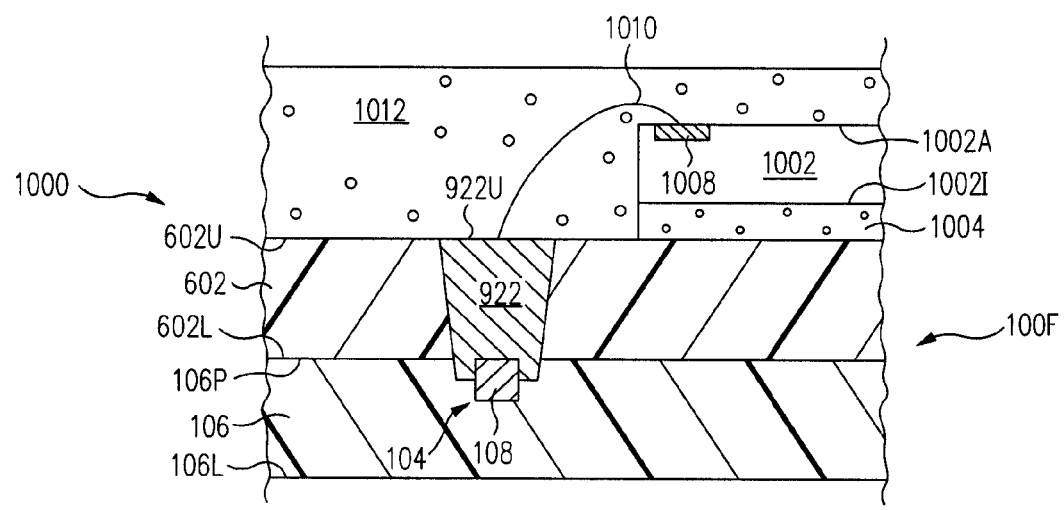
FIG. 10 a is a cross-sectional view of an electronic component package formed with the capture pad structure of FIG. 9C in accordance with one embodiment.

FIG. 10 is a cross-sectional view of an electronic component package 1000 formed with capture pad structure 100F of FIG. 9C in accordance with one embodiment. In accordance with this embodiment, capture pad structure 100F forms the substrate for package 1000.

Package 1000 includes an electronic component 1002, e.g., an active component such as an integrated circuit die, or a passive component such as a resistor, capacitor, or inductor. For simplicity of discussion, electronic component 1002 is herein referred to as integrated circuit die 1002.

An inactive, e.g., first, surface 1002I of integrated circuit die 1002 is mounted to upper surface 602U of upper dielectric layer 602 by an adhesive 1004, sometimes called a die attach adhesive.

An active, e.g., second, surface 1002A of integrated circuit die 1002 includes a bond pad 1008 formed thereon. Bond pad 1008 is electrically connected to upper surface 922U of blind via 922 by a bond wire 1010.

Integrated circuit die 1002, bond wire 1010, and at least a portion of upper surface 602U of upper dielectric layer 602 are enclosed within, sometimes called encapsulated, within an encapsulant 1012.

Figure 11:
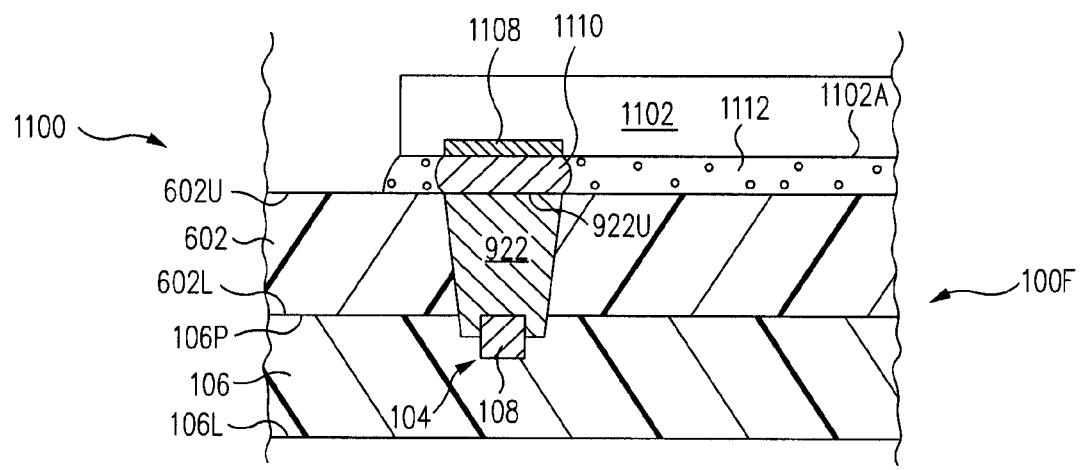
FIG. 11 is a cross-sectional view of an electronic component package formed with the capture pad structure of FIG. 9C in accordance with another embodiment.

FIG. 11 is a cross-sectional view of an electronic component package 1100 formed with capture pad structure 100F of FIG. 9C in accordance with another embodiment. In accordance with this embodiment, capture pad structure 100F forms the substrate for package 1100.

Package 1100 includes an electronic component 1102 mounted in a flip chip configuration. Electronic component 1102 is an active component such as an integrated circuit die, or a passive component such as a resistor, capacitor, or inductor. For simplicity of discussion, electronic component 1102 is herein referred to as integrated circuit die 1102.

An active, e.g., first, surface 1102A of integrated circuit die 1102 includes a bond pad 1108 formed thereon. Bond pad 1108 is electrically connected to upper surface 922U of blind via 922 by a flip chip bump 1110, e.g., solder.

Optionally, an underfill 1112 is applied between active surface 1102A and upper surface 602U of upper dielectric layer 602 and around flip chip bump 1110.

Figure 12:
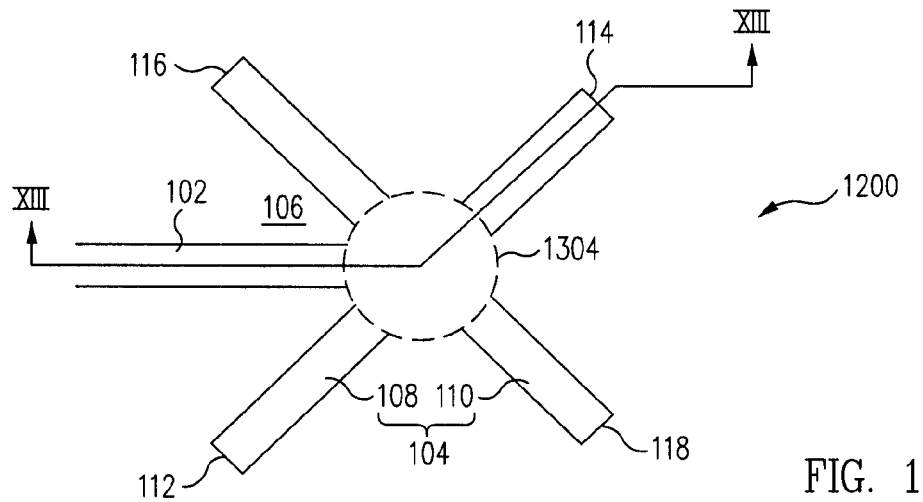
FIG. 12 is a top perspective view of a capture pad structure in accordance with one embodiment of the present invention.
Figure 13:
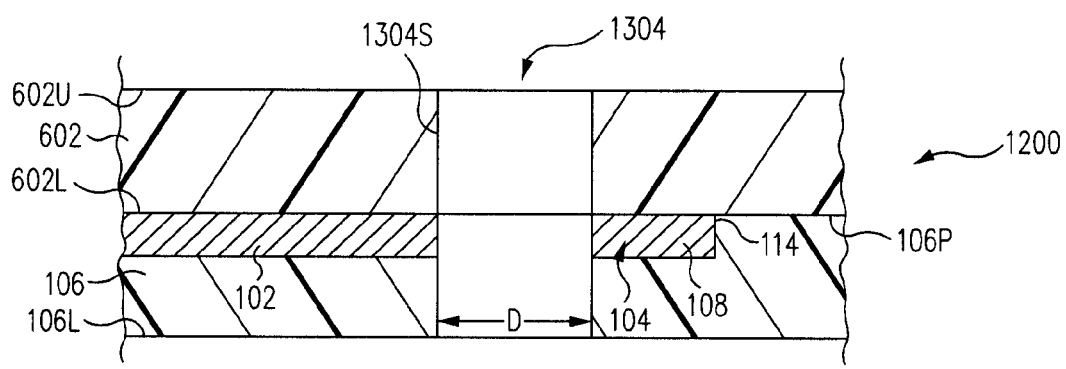
FIG. 13 is a cross-sectional view of the capture pad structure along the line XIII-XIII of FIG. 12.

FIG. 12 is a top perspective view of a capture pad structure 1200 in accordance with one embodiment of the present invention. FIG. 13 is a cross-sectional view of capture pad structure 1200 along the line XIII-XIII of FIG. 12. Capture pad structure 1200 of FIGS. 12, 13 is similar to capture pad structure 100 of FIGS. 5, 6 and only the significant differences are discussed below.

Referring now to FIGS. 12 and 13 together, capture pad structure 1200 includes trace 102, capture pad 104, lower dielectric layer 106, and upper dielectric layer 602.

A via aperture 1304 is formed through upper dielectric layer 602 and lower dielectric layer 106. Via aperture 1304 extends through upper dielectric layer 602 and lower dielectric layer 106 from upper surface 602U of upper dielectric layer 602 to lower surface 106L of lower dielectric layer 106. Via aperture 1304 extends through capture pad 104. Via aperture 1304 is defined by a via aperture sidewall 1304S that extends from upper surface 602U to lower surface 106L.

Generally, via aperture 1304 is aligned with capture pad 104. More particularly, via aperture 1304 passes through a portion of capture pad 104. The length of first linear segment 108 and second linear segment 110 is greater than a diameter D of via aperture 1304. Accordingly, tolerance in the registration (positioning) of via aperture 1304 relative to capture pad 104 is accommodated.

Via aperture 1304 is formed by mechanical drilling, laser ablation, chemical etching, or other via aperture fabrication process.

Figure 14:
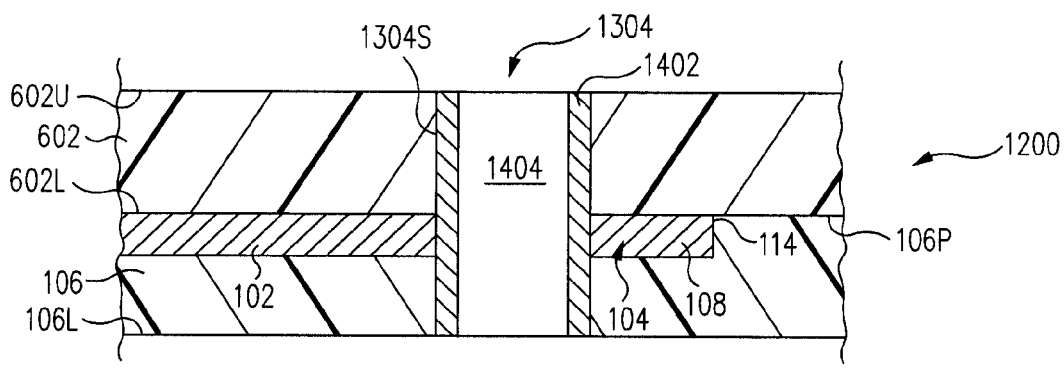
FIG. 14 is a cross-sectional view of the capture pad structure of FIG. 12 at a further stage of fabrication in accordance with one embodiment.

FIG. 14 is a cross-sectional view of capture pad structure 1200 of FIG. 12 at a further stage of fabrication in accordance with one embodiment. Referring now to FIG. 14, an electrically conductive via 1402 is formed within via aperture 1304. Via 1402, e.g., an electrically conductive plated copper layer, is formed on via aperture sidewall 1304S and extends from upper surface 602U to lower surface 106L. Via 1402, i.e., a hollow via, does not completely fill via aperture 1304 such that a space 1404 exists within via 1402. However, in another embodiment, via 1402 entirely fills via aperture 1304.

Via 1402 is electrically connected to capture pad 104. Accordingly, via 1402 forms the electrical connection to capture pad 104 through upper dielectric layer 602 and also through lower dielectric layer 106.

Although capture pad 104 is a plurality of linear segments arranged into a star configuration, a capture pad in accordance with other embodiments of the present invention is formed of a plurality of linear segment arranged in other configurations such as those illustrated in FIGS. 15, 16, 17, 18, 19, and 20.

Figure 15:
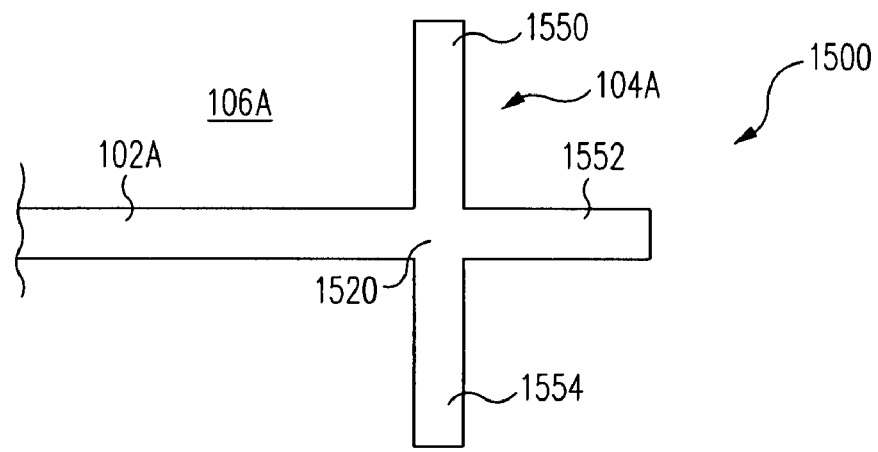
FIGS. 15, 16, 17, 18, 19, 20, and 21 are top perspective views of capture pad structures in accordance with various embodiment of the present invention.

FIG. 15 is a top perspective view of a capture pad structure 1500 in accordance with another embodiment of the present invention. Capture pad structure 1500 of FIG. 15 is similar to capture pad structure 100 of FIG. 1 and only the significant differences are discussed below.

Referring now to FIG. 15, capture pad structure 1500 includes a trace 102A, a capture pad 104A, and a dielectric layer 106A. Capture pad 104A, sometimes called a cross configuration capture pad, includes a plurality of interconnected linear segments, i.e., three linear segments 1550, 1552, and 1554. Linear segments 1550, 1552, 1554 are joined together at a linear segment intersection 1520.

Trace 102A extends from and is coupled to linear segment intersection 1520. Linear segment 1550 extends from linear segment intersection 1520 in a direction perpendicular to trace 102A. Linear segment 1552 extends from linear segment intersection 1520 in a direction parallel to but opposite from trace 102A, and perpendicular to linear segments 1550, 1554. Linear segment 1554 extends from linear segment intersection 1520 in a direction perpendicular to trace 102A and opposite linear segment 1550.

Figure 16:
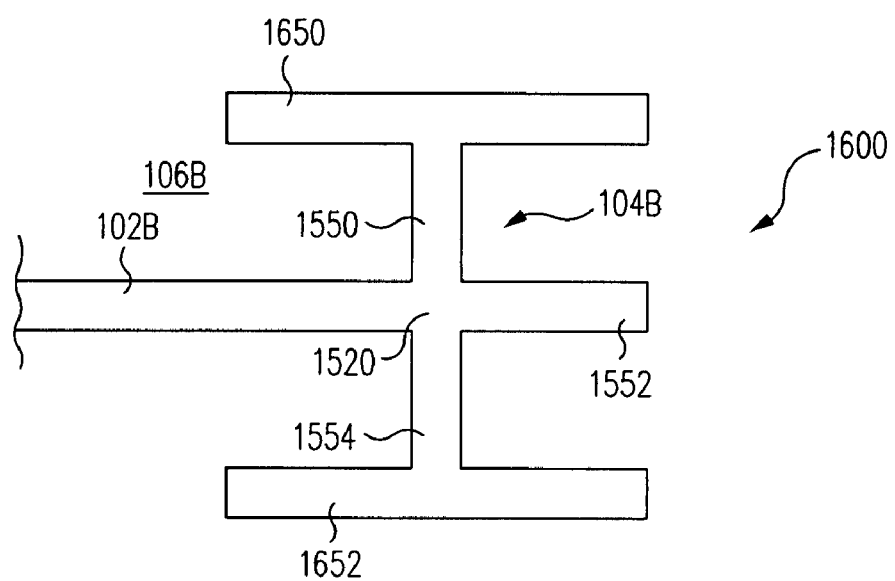

FIG. 16 is a top perspective view of a capture pad structure 1600 in accordance with another embodiment of the present invention. Capture pad structure 1600 of FIG. 16 is similar to capture pad structure 1500 of FIG. 15 and only the significant differences are discussed below.

Referring now to FIG. 16, capture pad structure 1600 includes a trace 102B, a capture pad 104B, and a dielectric layer 106B. Capture pad 104B, sometimes called a horizontal bars configuration capture pad, includes a plurality of interconnected linear segments, i.e., linear segments 1550, 1552, 1554, 1650, 1652.

In accordance with this embodiment, linear segment 1550 extends from linear segment intersection 1520 to linear segment 1650 and in a direction perpendicular to trace 102B. Linear segment 1650 is parallel to trace 102B and perpendicular to linear segment 1550. Further, linear segment 1550 is coupled to the middle of linear segment 1650.

Similarly, linear segment 1554 extends from linear segment intersection 1520 to linear segment 1652 and in a direction perpendicular to trace 102B. Linear segment 1652 is parallel to trace 102B and perpendicular to linear segment 1554. Further, linear segment 1554 is coupled the middle of linear segment 1652.

Figure 17:
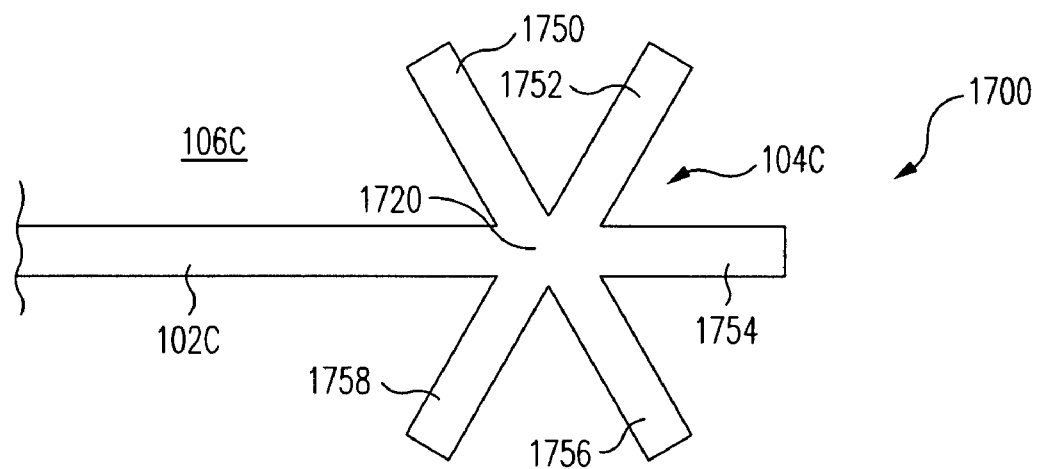

FIG. 17 is a top perspective view of a capture pad structure 1700 in accordance with another embodiment of the present invention. Capture pad structure 1700 of FIG. 17 is similar to capture pad structure 100 of FIG. 1 and only the significant differences are discussed below.

Referring now to FIG. 17, capture pad structure 1700 includes a trace 102C, a capture pad 104C, and a dielectric layer 106C. Capture pad 104C, sometimes called a spokes configuration capture pad, includes a plurality of interconnected linear segments, i.e., linear segments 1750, 1752, 1754, 1756, 1758 interconnected at a linear segment intersection 1720, sometimes called hub.

In accordance with this embodiment, linear segments 1750, 1752, 1754, 1756, 1758 and trace 102C extend radially outwards from linear segment intersection 1720.

Figure 18:
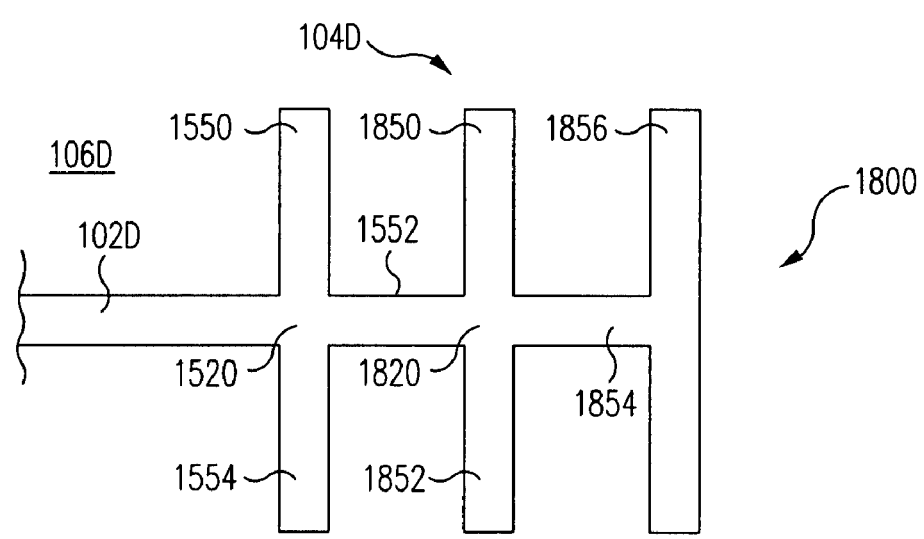

FIG. 18 is a top perspective view of a capture pad structure 1800 in accordance with another embodiment of the present invention. Capture pad structure 1800 of FIG. 18 is similar to capture pad structure 1500 of FIG. 15 and only the significant differences are discussed below.

Referring now to FIG. 18, capture pad structure 1800 includes a trace 102D, a capture pad 104D, and a dielectric layer 106D. Capture pad 104D, sometimes called a vertical bars configuration capture pad, includes a plurality of interconnected linear segments, i.e., linear segments 1550, 1552, 1554, 1850, 1852, 1854, 1856.

In accordance with this embodiment, linear segment 1552 extends from linear segment intersection 1520 to a second linear segment intersection 1820 and in a direction parallel to but opposite trace 102D. Linear segment 1850 extends from linear segment intersection 1820 in a direction perpendicular to linear segment 1552. Linear segment 1854 extends from linear segment intersection 1820 in a direction parallel to but opposite from linear segment 1552, and perpendicular to linear segments 1850, 1852. Linear segment 1852 extends from linear segment intersection 1820 in a direction perpendicular to linear segment 1552 and opposite linear segment 1850.

Linear segment 1854 extends from linear segment intersection 1820 to linear segment 1856. Linear segment 1854 is perpendicular to linear segment 1856. Further, linear segment 1854 is coupled to the middle of linear segment 1856.

Figure 19:
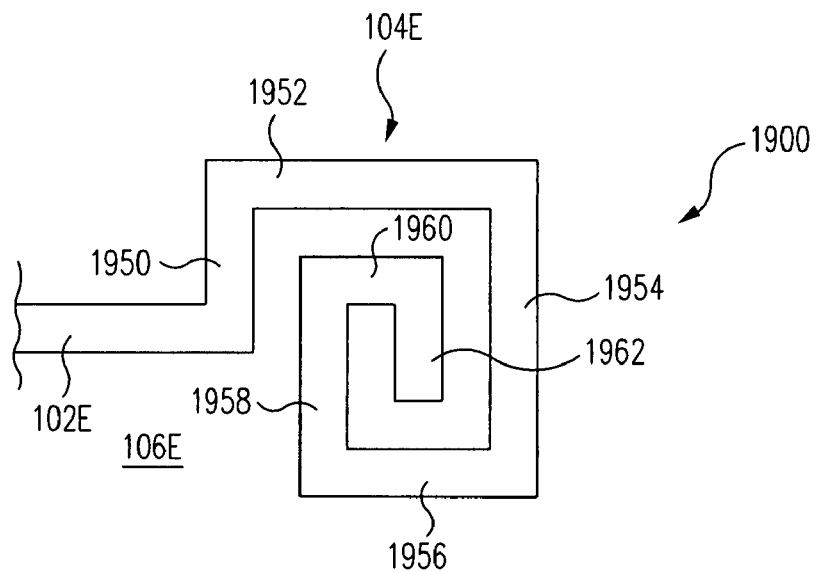

FIG. 19 is a top perspective view of a capture pad structure 1900 in accordance with another embodiment of the present invention. Capture pad structure 1900 of FIG. 19 is similar to capture pad structure 100 of FIG. 1 and only the significant differences are discussed below.

Referring now to FIG. 19, capture pad structure 1900 includes a trace 102E, a capture pad 104E, and a dielectric layer 106E. Capture pad 104E, sometimes called a maze configuration capture pad, includes a plurality of interconnected linear segments, i.e., linear segments 1950, 1952, 1954, 1956, 1958, 1960, 1962.

Linear segment 1950 extends perpendicularly from trace 102E to linear segment 1952. Linear segment 1952 extends perpendicularly from linear segment 1950 in a direction opposite but parallel to trace 102E to linear segment 1954. Linear segment 1954 extends perpendicularly from linear segment 1952 in a same direction and parallel to linear segment 1950 to linear segment 1956. Linear segment 1956 extends perpendicularly from linear segment 1954 in a same direction and parallel to linear segment 1952 to linear segment 1958. Linear segment 1958 extends perpendicularly from linear segment 1956 in a same direction and parallel to linear segment 1954 to linear segment 1960. Linear segment 1960 extends perpendicularly from linear segment 1958 in a same direction and parallel to linear segment 1956 to linear segment 1962. Linear segment 1962 extends perpendicularly from linear segment 1960 in a same direction and parallel to linear segment 1958.

Figure 20:
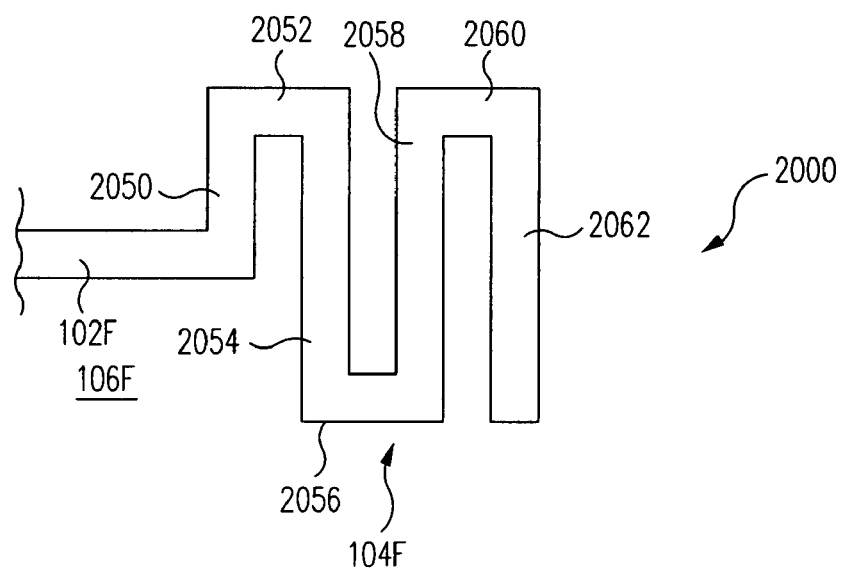

FIG. 20 is a top perspective view of a capture pad structure 2000 in accordance with another embodiment of the present invention. Capture pad structure 2000 of FIG. 20 is similar to capture pad structure 100 of FIG. 1 and only the significant differences are discussed below.

Referring now to FIG. 20, capture pad structure 2000 includes a trace 102F, a capture pad 104F, and a dielectric layer 106F. Capture pad 104F, sometimes called a serpentine configuration capture pad, includes a plurality of interconnected linear segments, i.e., linear segments 2050, 2052, 2054, 2056, 2058, 2060, 2062.

Linear segment 2050 extends perpendicularly from trace 102F to linear segment 2052. Linear segment 2052 extends perpendicularly from linear segment 2050 in a direction opposite but parallel to trace 102F to linear segment 2054. Linear segment 2054 extends perpendicularly from linear segment 2052 in a same direction and parallel to linear segment 2050 to linear segment 2056. Linear segment 2056 extends perpendicularly from linear segment 2054 in an opposite direction and parallel to linear segment 2052 to linear segment 2058. Linear segment 2058 extends perpendicularly from linear segment 2056 in a same direction and parallel to linear segment 2054 to linear segment 2060. Linear segment 2060 extends perpendicularly from linear segment 2058 in an opposite direction and parallel to linear segment 2056 to linear segment 2062. Linear segment 2062 extends perpendicularly from linear segment 2060 in a same direction and parallel to linear segment 2058.

Figure 21:
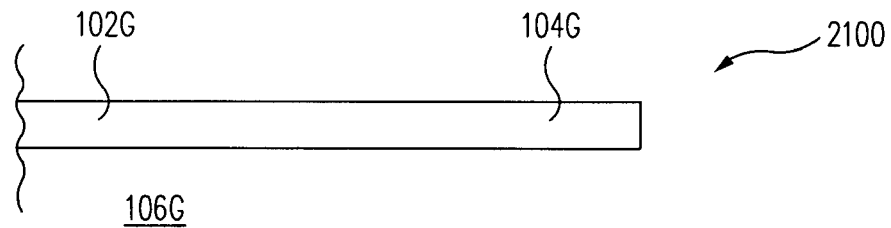

FIG. 21 is a top perspective view of a capture pad structure 2100 in accordance with another embodiment of the present invention. Capture pad structure 2100 of FIG. 21 is similar to capture pad structure 100 of FIG. 1 and only the significant differences are discussed below.

Referring now to FIG. 21, capture pad structure 2100 includes a trace 102G, a capture pad 104G, and a dielectric layer 106G. Capture pad 104G, sometimes called a straight line or linear trace extension capture pad, is simply the end portion of trace 102G, which is embedded in dielectric layer 106G. Accordingly, formation of capture pad 104G requires no change in direction or complex motion of the laser.

Figure 22:
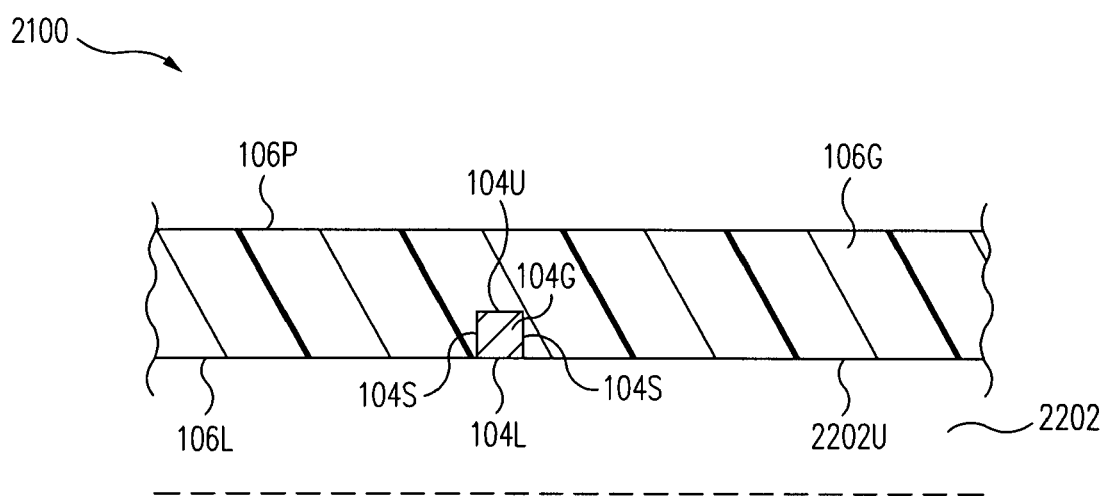
FIG. 22 is a cross-sectional view of the capture pad structure of FIG. 21 in accordance with one embodiment.

FIG. 22 is a cross-sectional view of capture pad structure 2100 of FIG. 21 in accordance with one embodiment. As illustrated in FIG. 22, capture pad structure 2100 of FIG. 21 is inverted such that capture pad 104G is embedded in a lower, e.g., first, surface 106L of dielectric layer 106G, e.g., a first dielectric layer. Capture pad 104G includes a lower, e.g., first, surface 104L coplanar with lower surface 106L of dielectric layer 106G. Capture pad 104G further includes an upper, e.g., second, surface 104U embedded within dielectric layer 106G and sidewalls 104S extending between lower surface 104L and upper surface 104U of capture pad 104G Optionally, a lower, e.g., second, dielectric layer 2202 is mounted to dielectric layer 106G. More particularly, an upper, e.g., first, surface 2202U of lower dielectric layer 2202 is mounted to lower surface 106L of dielectric layer 106G. In one embodiment, upper surface 2202U of lower dielectric 2202 and/or lower surface 106L of dielectric layer 106G is adhesive and/or includes an adhesive such that lower dielectric layer 2202 is adhesively bonded to dielectric layer 106G. In another embodiment, lower dielectric layer 2202 is applied to dielectric layer 106G in a liquid form and then cured, e.g., lower dielectric layer 2202 is a cured liquid encapsulant, molding compound, a spin on coating, or other cured material. Lower dielectric layer 2202 can include one or more circuit patterns and/or electrically conductive vias.

However, lower dielectric layer 2202 is optional and in one embodiment is not formed. Accordingly, although lower dielectric layer 2202 is not illustrated or discussed in relation to FIGS. 23, 24, and 25, in light of this disclosure, those of skill in the art will understand that the structures illustrated include lower dielectric layer 2202 in other embodiments.

Figure 23:
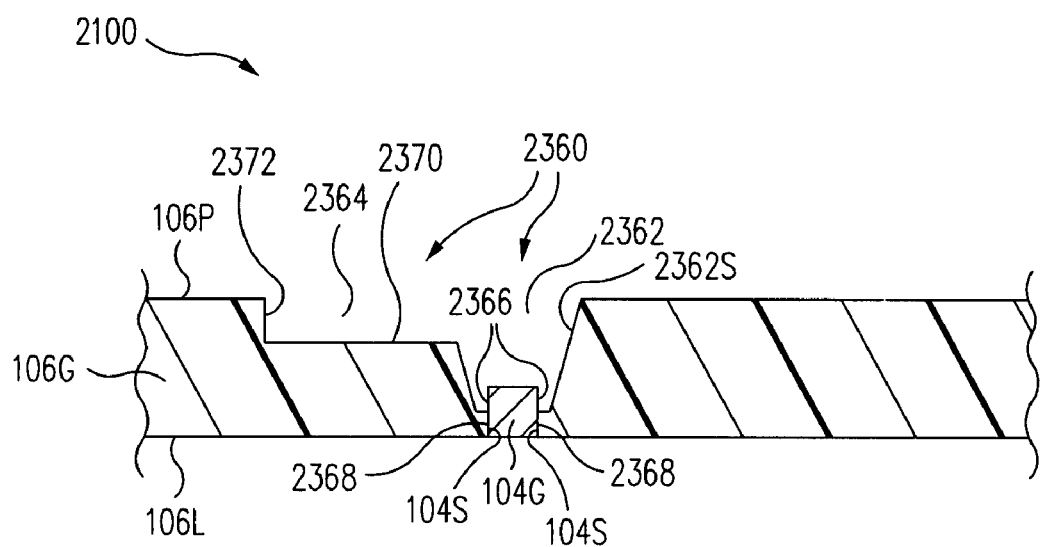
FIGS. 23, 24, and 25 are cross-sectional views of the capture pad structure of FIG. 22 at further stages of fabrication in accordance with various embodiments.

FIG. 23 is a cross-sectional view of capture pad structure 2100 of FIG. 22 at a further stage of fabrication in accordance with one embodiment. Referring now to FIG. 23, laser-ablated artifacts 2360 including a blind via aperture 2362 and a channel 2364 are formed partially through and into dielectric layer 106G, e.g., using laser ablation. Blind via aperture 2362 extends nearly through dielectric layer 106G from principal surface 106P to capture pad 104G. Blind via aperture 2362 is defined by a blind via aperture sidewall 2362S that extends from principal surface 106P to capture pad 104G and partially through dielectric layer 106G.

Blind via aperture 2362 extends into dielectric layer 106G around capture pad 104G. Blind via aperture 2362 is formed using a laser ablation over drill process. During this laser ablation over drill process, the energy and ablation time of the focused laser beam, e.g., a low fluence laser beam, is set sufficiently high to laser ablate partially through dielectric layer 106G and around capture pad 104G.

Dielectric layer 106G, e.g., molding compound, laminate material, flexible tape, or other dielectric material, is selectively laser ablated relative to capture pad 104G, e.g., an electrically conductive material such as copper. Stated another way, dielectric layer 106G is laser ablated (removed) by the focused laser beam whereas capture pad 104G is substantially unaffected by the focused laser beam. Accordingly, during the laser ablation over drill process, dielectric layer 106G is removed around capture pad 104G.

As shown in FIG. 23, dielectric layer 106G is over drilled such that a portion of sidewalls 104S of capture pad 104G is exposed by blind via aperture 2362. The other portion of sidewalls 104S of capture pad 104G remains embedded and in contact with dielectric layer 106G.

To illustrate, dielectric layer 106G is removed around an upper, e.g., first, portion 2366 of sidewalls 104S of capture pad 104G as illustrated in FIG. 23. A lower, e.g., second, portion 2368 of sidewalls 104S of capture pad 104G remains embedded and in contact with dielectric layer 106G.

Generally, blind via aperture 2362 is aligned with capture pad 104G. More particularly, a portion of capture pad 104G is exposed through blind via aperture 2362.

In one embodiment, a laser-ablated channel, sometimes called a trench, extends horizontally and in a direction parallel with principal surface 106P of dielectric layer 106G. To illustrate, laser-ablated artifacts 2360 include channel 2364. Channel 2364 is defined by a channel base 2370, i.e., a recessed surface of dielectric layer 106G. Channel base 2370 is recessed below principal surface 106P of dielectric layer 106G. Stated another way, channel base 2370 is between a plane defined by principal surface 106P of dielectric layer 106G and a plane defined by lower surface 106L of dielectric layer 106G such that dielectric layer 106G remains between channel base 2370 and lower surface 106L of dielectric layer 106G.

Channel 2364 is further defined by a channel sidewall 2372. Channel sidewall 2372 extends between channel base 2370 and principal surface 106P of dielectric layer 106G.

Figure 24:
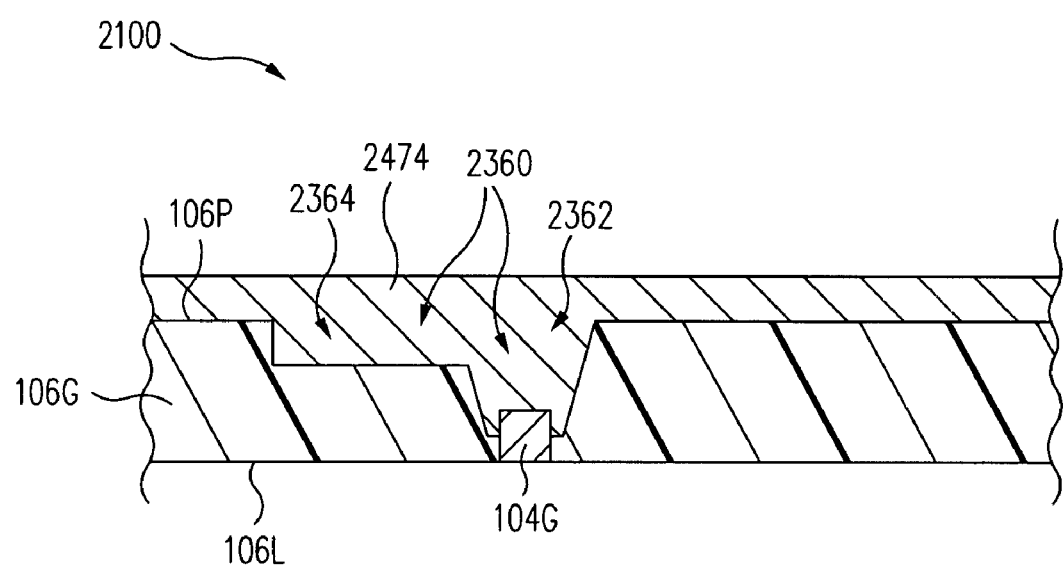

FIG. 24 is a cross-sectional view of capture pad structure 2100 of FIG. 23 at a further stage of fabrication in accordance with one embodiment. Referring now to FIG. 24, a conductor layer 2474 is formed, e.g., by electro or electroless plating, to fill laser-ablated artifacts including blind via aperture 2362 and channel 2364. Further, conductor layer 2474 is overplated such that conductor layer 2474 is also formed on principal surface 106P of dielectric layer 106G.

Although conductor layer 2474 is illustrated as a single layer, in another embodiment, conductor layer 2474 is a bi-layer structure including a seed layer and a primary conductor layer.

Figure 25:
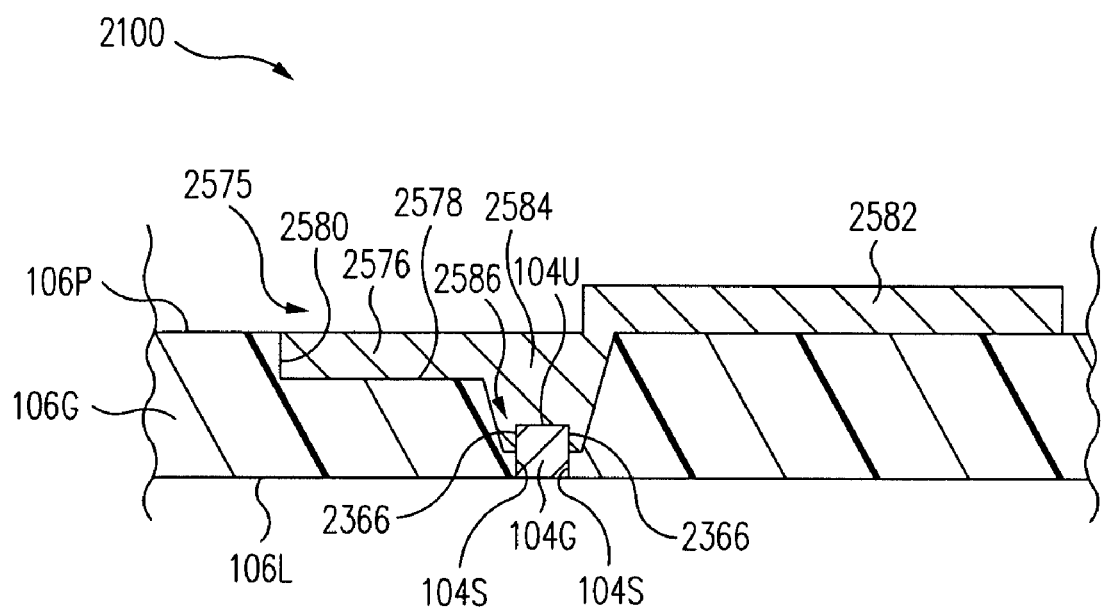

FIG. 25 is a cross-sectional view of capture pad structure 2100 of FIG. 24 at a further stage of fabrication in accordance with one embodiment. Referring now to FIGS. 24 and 25 together, conductor layer 2474 is patterned and selectively etched to form a circuit pattern 2575 as illustrated in FIG. 25.

Circuit pattern 2575 includes an embedded trace 2576 embedded within dielectric layer 106G at principal surface 106P. Embedded trace 2576 includes a trace base 2578 and a trace sidewall 2580 corresponding to channel base 2370 and channel sidewall 2372 (see FIG. 23) discussed above and so is not repeated here.

Circuit pattern 2575 further includes exposed trace 2582 formed on principal surface 106P of dielectric layer 106G.

Further, circuit pattern 2575 further includes a blind via 2584, which fills blind via aperture 2362 (FIG. 23).

Blind via 2584 extends from principal surface 106P to capture pad 104G. Blind via 2584 is electrically connected to capture pad 104G. Blind via 2584 extends around capture pad 104G. More particularly, blind via 2584 directly contacts upper surface 104U of capture pad 104G and upper portion 2366 of sidewalls 104S of capture pad 104G.

To illustrate, an interlocking structure 2586 of blind via 2584 contacts upper surface 104U and upper portion 2366 of sidewalls 104S of capture pad 104G as illustrated in FIG. 25. Accordingly, blind via 2584 forms the electrical connection to capture pad 104G through dielectric layer 106G.

In accordance with this example, by over drilling into dielectric layer 106G and around capture pad 104G during formation of blind via aperture 2362 as discussed above, interlocking structure 2586 of blind via 2584 extends around capture pad 104G. By forming blind via 2584 with interlocking structure 2586 around capture pad 104G, the mechanical strength in the bond between blind via 2584 and capture pad 104G is maximized. In this manner, the reliability of the bond between blind via 2584 and capture pad 104G is insured.

Further, embedded trace 2576 and exposed trace 2582 are electrically connected to blind via 2584 and thus to capture pad 104G. Accordingly, circuit pattern 2575 includes exposed traces such as exposed trace 2582 formed on principal surface 106P of dielectric layer 106G as well as embedded traces such as embedded trace 2576 embedded within dielectric layer 106G at principal surface 106P.

Figure 26:
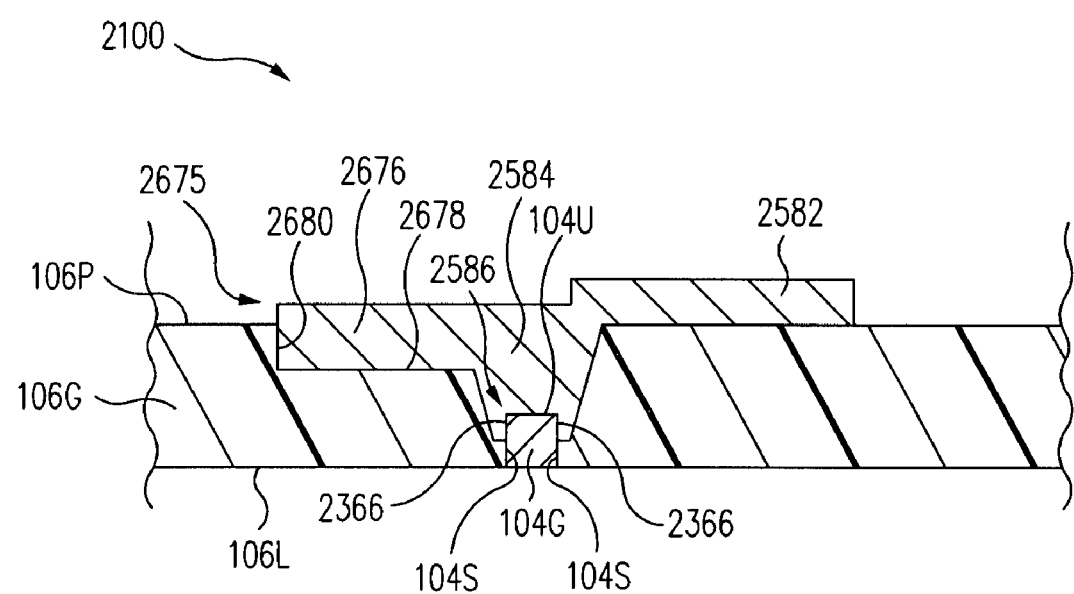
FIG. 26 is a cross-sectional view of the capture pad structure of FIG. 24 at a further stage of fabrication in accordance with another embodiment.

FIG. 26 is a cross-sectional view of capture pad structure 2100 of FIG. 24 at a further stage of fabrication in accordance with another embodiment. Referring now to FIGS. 24 and 26 together, conductor layer 2474 is etched by a two step etching process, which is well known to a person having ordinary skill in the art, to form a circuit pattern 2675 including a partially embedded trace 2676 as illustrated in FIG. 26.

More particularly, circuit pattern 2675 includes partially embedded trace 2676 partially embedded within dielectric layer 106G at principal surface 106P and partially exposed from (protruding from) principal surface 106P of dielectric layer 106G. Partially embedded trace 2676 includes a trace base 2678 corresponding to channel base 2370 (see FIG. 23) discussed above and so is not repeated here.

Partially embedded trace 2676 further includes a trace sidewall 2680 in contact with and extending outwardly beyond channel sidewall 2372 (see FIG. 23). More particularly, in accordance with this embodiment, trace sidewall 2680 extends both inward and outward from principal surface 106P of dielectric layer 106G. Accordingly, partially embedded trace 2676 is sometimes referred to as an in plane out of plane trace.

Circuit pattern 2675 further includes exposed trace 2582 and blind via 2584, which are discussed above in reference to FIG. 25 and so not repeated here. In accordance with this embodiment, partially embedded trace 2676 is connected to blind via 2584 and thus to capture pad 104G.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A capture pad structure comprising:
   an integral first dielectric layer;
   a trace embedded within the first dielectric layer;
   a capture pad embedded within the first dielectric layer, the capture pad comprising:
      an end portion of the trace;
      a first surface coplanar with a lower surface of the first dielectric layer;
      a second surface within the first dielectric layer; and
      a first sidewall extending between the first surface of the capture pad and the second surface of the capture pad; and
      a second sidewall extending between the first surface of the capture pad and the second surface of the capture pad;
   laser-ablated artifacts in the first dielectric layer, the laser-ablated artifacts comprising:
      a blind via aperture extending partially through the first dielectric layer from a planar principal surface of the first dielectric layer to the capture pad, wherein a first portion of the first sidewall and a first portion of the second sidewall of the capture pad are exposed by the blind via aperture, and wherein a second portion of the first sidewall and a second portion of the second sidewall of the capture pad are embedded within and in direct contact with the first dielectric layer; and
      a channel comprising a channel base and a channel sidewall, the channel sidewall extending between the channel base and the principal surface of the first dielectric layer; and
   a partially embedded trace in the channel, wherein the partially embedded trace is partially embedded within the first dielectric layer and partially exposed from the first dielectric layer, wherein the partially embedded trace comprises a trace sidewall in contact with and extending outward beyond the channel sidewall, the trace sidewall extending both inward and outward from the principal surface of the first dielectric layer; and
   an exposed trace on the principal surface of the first dielectric layer.

2. The capture pad structure of claim 1 wherein the blind via aperture is defined by a blind via aperture sidewall.

3. The capture pad structure of claim 1 further comprising an electrically conductive blind via within the blind via aperture, the blind via contacting the first portion of the first sidewall and the first portion of the second sidewall.

4. The capture pad structure of claim 1 wherein the blind via aperture extends into the first dielectric layer around the capture pad.

5. The capture pad structure of claim 1 further comprising an electrically conductive blind via within the blind via aperture.

6. The capture pad structure of claim 1 further comprising a second dielectric layer mounted to the first dielectric layer.

7. The capture pad structure of claim 6 wherein a first surface of the second dielectric layer is mounted to the lower surface of the first dielectric layer.

8. The capture pad structure of claim 1 wherein the channel base is recessed below the principal surface of the first dielectric layer such that the channel base is between a plane defined by the principal surface and a plane defined by the lower surface of the first dielectric layer.

9. A capture pad structure comprising:
   an integral first dielectric layer comprising a planar principal surface and a lower surface;
   a trace embedded within the first dielectric layer at the lower surface;
   a capture pad embedded within the first dielectric layer at the lower surface, the capture pad comprising an end portion of the trace;
   a blind via aperture extend partially through the first dielectric layer from the principal surface of the first dielectric layer to the capture pad, wherein a first portion of a first sidewall and a first portion of a second sidewall of the capture pad are exposed by the blind via aperture, and wherein a second portion of the first sidewall and a second portion of the second sidewall of the capture pad are embedded within and in direct contact with the first dielectric layer;
   an electrically conductive blind via within the blind via aperture, an interlocking structure of the blind via contacting the first portion of the first sidewall and the first portion of the second sidewall;
   a partially embedded trace partially embedded within the first dielectric layer and partially exposed from the first dielectric layer, wherein the partially embedded trace comprises a trace sidewall extending both inward and outward from the principal surface of the first dielectric layer; and
   an exposed trace on the principal surface of the first dielectric layer.

10. A capture pad structure comprising:
    a linear channel formed in a lower surface of an integral first dielectric layer;
    a capture pad embedded within the first dielectric layer at the lower surface comprising an electrically conductive material filling the linear channel;
    laser-ablated artifacts in a planar principal surface of the first dielectric layer, the laser-ablated artifacts comprising a blind via aperture extending from the principal surface of the first dielectric layer to the capture pad, the laser-ablated artifacts further comprising a channel;

a circuit pattern, the circuit pattern comprising:
- a blind via in the blind via aperture, the blind via being electrically coupled to the capture pad, wherein the blind via comprises an interlocking structure extending around a first portion of a first sidewall and a first portion of a second sidewall of the capture pad, and wherein a second portion of the first sidewall and a second portion of the second sidewall of the capture pad are embedded within and in direct contact with the first dielectric layer;
- a partially embedded trace within the channel, wherein the partially embedded trace is partially embedded within the first dielectric layer and partially exposed from the first dielectric layer, wherein the partially embedded trace comprises a trace sidewall extending both inward and outward from the principal surface of the first dielectric layer; and
- an exposed trace on the principal surface of the first dielectric layer.

11. The capture pad structure of claim 1 wherein the partially embedded trace comprises an in plane out of plane trace.

* * * * *

UNITED STATES PATENT AND TRADEMARK OFFICE
CERTIFICATE OF CORRECTION

PATENT NO. : 8,323,771 B1
APPLICATION NO. : 11/839277
DATED : December 4, 2012
INVENTOR(S) : Ronald Patrick Huemoeller and Sukianto Rusli It is certified that error appears in the above-identified patent and that said Letters Patent is hereby corrected as shown below:

In the Claims:

In Column 16, Line 31, Claim 9, after "via aperture", replace "extend" with --extending--.

Signed and Sealed this
Fourteenth Day of May, 2013

Teresa Stanek Rea
*Acting Director of the United States Patent and Trademark Office*